(12) United States Patent
LeToquin et al.

(10) Patent No.: US 8,921,875 B2
(45) Date of Patent: Dec. 30, 2014

(54) RECIPIENT LUMINOPHORIC MEDIUMS HAVING NARROW SPECTRUM LUMINESCENT MATERIALS AND RELATED SEMICONDUCTOR LIGHT EMITTING DEVICES AND METHODS

(75) Inventors: Ronan P. LeToquin, Fremont, CA (US); Tao Tong, Oxnard, CA (US); Robert C. Glass, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 452 days.

(21) Appl. No.: 13/104,238

(22) Filed: May 10, 2011

(65) Prior Publication Data
US 2012/0286304 A1 Nov. 15, 2012

(51) Int. Cl.
*H01L 29/20* (2006.01)

(52) U.S. Cl.
USPC ............... 257/89; 257/90; 257/12; 257/13; 257/78

(58) Field of Classification Search
USPC ............ 313/483; 257/12, 13, 78, 89, 90
See application file for complete search history.

(56) References Cited

U.S. PATENT DOCUMENTS

| | | | |
|---|---|---|---|
| 7,095,056 | B2 | 8/2006 | Vitta et al. |
| 7,213,940 | B1 | 5/2007 | Van de Ven et al. |
| 2007/0139920 | A1 | 6/2007 | Van de Ven et al. |
| 2007/0170447 | A1 | 7/2007 | Negley et al. |
| 2007/0267983 | A1 | 11/2007 | Van de Ven et al. |
| 2007/0278503 | A1 | 12/2007 | Van de Ven et al. |
| 2007/0278934 | A1 | 12/2007 | Van de Ven et al. |
| 2007/0278935 | A1 | 12/2007 | Harada |
| 2008/0130285 | A1 | 6/2008 | Negley et al. |
| 2008/0179602 | A1 | 7/2008 | Negley et al. |
| 2008/0310154 | A1 | 12/2008 | Van de Ven et al. |
| 2009/0039375 | A1 | 2/2009 | LeToquin et al. |
| 2009/0184616 | A1 | 7/2009 | Van de Ven et al. |
| 2009/0231832 | A1 | 9/2009 | Zukauskas et al. |
| 2009/0242917 | A1 | 10/2009 | Inoue et al. |
| 2010/0059782 | A1* | 3/2010 | Fujitomo et al. ............. 257/98 |
| 2010/0119839 | A1* | 5/2010 | Chen ......................... 428/422 |
| 2010/0140634 | A1 | 6/2010 | Van de Ven et al. |
| 2010/0155763 | A1 | 6/2010 | Donofrio et al. |
| 2010/0254130 | A1 | 10/2010 | Van de Ven et al. |

(Continued)

FOREIGN PATENT DOCUMENTS

| | | |
|---|---|---|
| WO | WO 2006/129228 A2 | 12/2006 |
| WO | WO 2009/117287 A2 | 9/2009 |

OTHER PUBLICATIONS

International Preliminary Report on Patentability Corresponding to International Application No. PCT/US2012/027671; Date of Mailing: Nov. 21, 2013; 14 Pages.
U.S. Appl. No. 12/720,390, filed Mar. 9, 2010, Collins et al.

(Continued)

*Primary Examiner* — Jae Lee
(74) *Attorney, Agent, or Firm* — Myers Bigel Sibley & Sajovec

(57) ABSTRACT

Light emitting devices include a light emitting diode ("LED") and a recipient luminophoric medium that is configured to down-convert at least some of the light emitted by the LED. In some embodiments, the recipient luminophoric medium includes a first broad-spectrum luminescent material and a narrow-spectrum luminescent material. The broad-spectrum luminescent material may down-convert radiation emitted by the LED to radiation having a peak wavelength in the red color range. The narrow-spectrum luminescent material may also down-convert radiation emitted by the LED into the cyan, green or red color range.

34 Claims, 24 Drawing Sheets

(56) References Cited

U.S. PATENT DOCUMENTS

| | | |
|---|---|---|
| 2010/0289044 A1 | 11/2010 | Krames et al. |
| 2011/0019399 A1 | 1/2011 | Van de Ven et al. |
| 2011/0037413 A1* | 2/2011 | Negley et al. ............... 315/294 |
| 2011/0260192 A1* | 10/2011 | Kwak et al. .................. 257/98 |
| 2012/0001204 A1* | 1/2012 | Jagt ............................ 257/88 |
| 2012/0146066 A1* | 6/2012 | Tischler et al. ............... 257/89 |
| 2012/0187865 A1* | 7/2012 | Chung et al. ................ 315/294 |

OTHER PUBLICATIONS

International Search Report Corresponding to International Application No. PCT/US12/27671; Date of Mailing: Jun. 22, 2012; 20 Pages.
Supplementary European Search Report for Application No. EP 12 78 2214; Date of Mailing: Sep. 30, 2014; 7 Pages.

* cited by examiner

RECIPIENT LUMINOPHORIC MEDIUMS HAVING NARROW SPECTRUM LUMINESCENT MATERIALS AND RELATED SEMICONDUCTOR LIGHT EMITTING DEVICES AND METHODS

STATEMENT OF GOVERNMENT INTEREST

The present invention was developed with Government support under Department of Energy Contract No. DE-FC26-08NT01577. The Government has certain rights in this invention

BACKGROUND

The present invention relates to light emitting devices and, more particularly, to semiconductor light emitting devices that include recipient luminophoric mediums.

A wide variety of light emitting devices are known in the art including, for example, incandescent light bulbs, fluorescent lights and semiconductor light emitting devices such as light emitting diodes ("LEDs"). LEDs generally include a series of semiconductor layers that may be epitaxially grown on a substrate such as, for example, a sapphire, silicon, silicon carbide, gallium nitride or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with corresponding holes and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

Most LEDs are nearly monochromatic light sources that appear to emit light having a single color. Thus, the spectral power distribution of the light emitted by most LEDs is tightly centered about a "peak" wavelength, which is the single wavelength where the spectral power distribution or "emission spectrum" of the LED reaches its maximum as detected by a photo-detector. The "width" of the spectral power distribution of most LEDs is between about 10 nm and 30 nm, where the width is measured at half the maximum illumination on each side of the emission spectrum (this width is referred to as the full-width-half-maximum or "FWHM" width).

In order to use LEDs to generate white light, LED lamps have been provided that include several LEDs that each emit a light of a different color. The different colored light emitted by the LEDs combine to produce a desired intensity and/or color of white light. For example, by simultaneously energizing red, green and blue LEDs, the resulting combined light may appear white, or nearly white, depending on, for example, the relative intensities, peak wavelengths and spectral power distributions of the source red, green and blue LEDs.

White light may also be produced by surrounding a single LED with one or more luminescent materials such as phosphors that convert some of the light emitted by the LED to light of one or more other colors. The combination of the light emitted by the single-color LED that is not converted by the luminescent material(s) and the light of other colors that are emitted by the luminescent material(s) may produce a white or near-white light.

As one example, a white LED lamp may be formed by coating a gallium nitride-based blue LED with a yellow luminescent material such as a cerium-doped yttrium aluminum garnet phosphor, which has the chemical formula $Y_3Al_5O_{12}$: Ce, and is commonly referred to as YAG:Ce. The blue LED produces an emission with a peak wavelength of, for example, about 460 nm. Some of blue light emitted by the LED passes between and/or through the YAG:Ce phosphor particles without being down-converted, while other of the blue light emitted by the LED is absorbed by the YAG:Ce phosphor, which becomes excited and emits yellow fluorescence with a peak wavelength of about 550 nm (i.e., the blue light is down-converted to yellow light). The combination of blue light and yellow light that is emitted by the coated LED may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red-light emitting luminescent materials such as $Eu^{2+}$ doped $CaAlSiN_3$ based phosphor particles may be added to the coating.

Phosphors are the luminescent materials that are most widely used to convert a single-color (typically blue or violet) LED into a white LED. Herein, the term "phosphor" may refer to any material that absorbs light at one wavelength and re-emits light at a different wavelength in the visible spectrum, regardless of the delay between absorption and re-emission and regardless of the wavelengths involved. Thus, the term "phosphor" encompasses materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths. In addition to phosphors, other luminescent materials include scintillators, day glow tapes, nanophosphors, quantum dots, and inks that glow in the visible spectrum upon illumination with (e.g., ultraviolet) light.

A medium that includes one or more luminescent materials that is positioned to receive light that is emitted by an LED or other semiconductor light emitting device is referred to herein as a "recipient luminophoric medium." Exemplary recipient luminophoric mediums include layers having luminescent materials that are coated or sprayed directly onto a semiconductor light emitting device or on surfaces of the packaging thereof, and clear encapsulents (e.g., epoxy-based or silicone-based curable resin) that include luminescent materials that are arranged to partially or fully cover a semiconductor light emitting device. A recipient luminophoric medium may include one medium layer or the like in which one or more luminescent materials are mixed, multiple stacked layers or mediums, each of which may include one or more of the same or different luminescent materials, and/or multiple spaced apart layers or mediums, each of which may include the same or different luminescent materials.

SUMMARY

Pursuant to some embodiments of the present invention, light emitting devices are provided that include an LED and a recipient luminophoric medium that is configured to down-convert at least some of the light emitted by the LED. This recipient luminophoric medium may include both a first broad-spectrum luminescent material that down-converts a first portion of the radiation emitted by the LED to radiation having a peak wavelength in the red color range and a narrow-spectrum luminescent material that down-converts a second portion of the radiation emitted by the LED.

In some embodiments, the recipient luminophoric medium may also include a second broad-spectrum luminescent material that down-converts a third portion of the radiation emitted by the LED to radiation having a peak wavelength in a color range other than the red color range. In some embodiments, the radiation emitted by the second broad-spectrum luminescent material has a peak wavelength in the green color range and has a full-width-half-maximum emission bandwidth that extends into the cyan color range and/or has a peak wavelength between 525 nm and 550 nm and has a full-width-half-maximum emission bandwidth that extends below 500 nm. In some embodiments, the radiation emitted by the narrow-spectrum luminescent material has a peak wavelength in either the red, green or cyan color ranges. The narrow-spectrum luminescent material may be a line-emitter luminescent material.

In some embodiments, the recipient luminophoric medium may also include a third broad-spectrum luminescent material that down-converts a fourth portion of the radiation emitted by the LED to a radiation having a peak wavelength between 551 nm and 585 nm. In some embodiments, the first broad-spectrum luminescent material comprises a $(Ca_{1-x}Sr_x)SiAlN_3:Eu^{2+}$ phosphor, the second broad-emission luminescent material comprises a LuAG:Ce phosphor, and the third broad-spectrum luminescent material comprises a YAG:Ce phosphor. The light emitting device may be designed to emit a warm white light having a correlated color temperature between about 2500 K and about 4100 K, a CRI value of at least 90 and a Lumen equivalent output of at least 330 Lum/W-Optical. In some embodiments, the recipient luminophoric medium may be directly applied onto the LED, and may include a binder material that is cured by heat energy in the LED at the time the recipient luminophoric medium is applied.

Pursuant to further embodiments of the present invention, light emitting devices are provided that include an LED and a recipient luminophoric medium that is configured to down-convert at least some of the light emitted by the LED. In these devices, the recipient luminophoric medium includes at least a first broad-spectrum luminescent material that down-converts a first portion of the radiation emitted by the LED to radiation having a peak wavelength in a first color range (e.g., red) and a first narrow-spectrum luminescent material that down-converts a second portion of the radiation emitted by the LED to radiation having a peak wavelength in the first color range.

In some embodiments, the recipient luminophoric medium also includes a second broad-spectrum luminescent material that down-converts a third portion of the radiation emitted by the LED to radiation having a peak wavelength in the yellow color range and/or a third broad-spectrum luminescent material that down-converts a fourth portion of the radiation emitted by the LED to radiation having a peak wavelength in the green color range (with a full-width-half-maximum emission bandwidth that extends into the cyan color range). The recipient luminophoric medium may also include a second narrow-spectrum luminescent material that down-converts a portion of the radiation emitted by the LED to radiation having a peak wavelength in the cyan color range. In some embodiments, the first broad-emission luminescent material may be a red phosphor having a peak wavelength of less than 620 nm and a full-width-half-maximum emission bandwidth of between about 60 nm and about 80 nm Pursuant to additional embodiments of the present invention, light emitting devices are provided that include an LED and a recipient luminophoric medium that is configured to down-convert at least some of the light emitted by the LED. In these devices, the recipient luminophoric medium may include a first broad-spectrum luminescent material that down-converts a first portion of the radiation emitted by the LED to radiation having a peak wavelength above the cyan color range and a first narrow-spectrum luminescent material that down-converts a second portion of the radiation emitted by the LED to radiation having a peak wavelength below the yellow color range.

In some embodiments, the radiation emitted by the first broad-spectrum luminescent material may have a peak wavelength in the red color range, and the recipient luminophoric medium may also include a second broad-spectrum luminescent material that down-converts a third portion of the radiation emitted by the LED to radiation having a peak wavelength in a color range other than the red color range. In some embodiments, the radiation emitted by the first narrow-spectrum luminescent material has a peak wavelength in either the cyan or green color ranges. The recipient luminophoric medium may further include a second narrow-spectrum luminescent material that down-converts a fourth portion of the radiation emitted by the LED to radiation having a peak wavelength in the red color range.

Pursuant to still further embodiments of the present invention, light emitting devices are provided that include an LED and a recipient luminophoric medium that is configured to down-convert at least some of the light emitted by the LED. In these devices, the recipient luminophoric medium includes a first broad-spectrum luminescent material that down-converts a first portion of the radiation emitted by the LED to radiation having a peak wavelength that is between 610 and 629 nm and a second broad-spectrum luminescent material that down-converts a second portion of the radiation emitted by the LED to radiation having a peak wavelength below 600 nm.

In some embodiments, the recipient luminophoric medium may also include a narrow-spectrum luminescent material that down-converts a third portion of the radiation emitted by the LED to radiation having a peak wavelength in the red, green or cyan color ranges. The radiation emitted by the second broad-spectrum luminescent material may, in some embodiments, have a peak wavelength in the green color range and a full-width-half-maximum emission bandwidth that extends into the cyan color range.

Pursuant to yet additional embodiments of the present invention, methods of forming a light emitting devices are provided in which a semiconductor light emitting device is heated (e.g., at a temperature of at least about 90 degrees Celsius) and a luminescent solution is applied to the heated semiconductor light emitting device. The luminescent solution may include a first broad-spectrum luminescent material and a narrow-spectrum luminescent material.

In some embodiments, the first broad-spectrum luminescent material down-converts a first portion of the radiation emitted by the semiconductor-based lighting source to radiation that has a peak wavelength in the red color range, and the narrow-spectrum luminescent material down-converts a second portion of the radiation emitted by the semiconductor light emitting device to radiation that has a peak wavelength in the red color range. The luminescent solution may also include a second broad-spectrum luminescent material that down-converts a third portion of the radiation emitted by the semiconductor light emitting device to radiation that has a peak wavelength in the yellow color range and, in some cases, a third broad-spectrum luminescent material that down-converts a fourth portion of the radiation emitted by the semiconductor light emitting device to radiation having a peak wavelength in the green color range that has a full-width-half-maximum emission bandwidth that extends into the cyan color range.

In some embodiments, the radiation emitted by the narrow-spectrum luminescent material has a peak wavelength in the cyan or red color ranges. The luminescent solution may be cured to convert the luminescent solution into a recipient luminophoric medium. The luminescent solution may include a binder material. In some embodiments, the first broad-spectrum luminescent material and the narrow-spectrum luminescent material may each include wavelength conversion particles, and the luminescent solution may comprise the wavelength conversion particles suspended in a solution including a volatile solvent or a nonvolatile solvent and a binder material. In such embodiments, the volatile solvent may be evaporated via thermal energy in the heated semiconductor light emitting device may evaporate the volatile solvent or cure the nonvolatile solvent from the luminescent solution to provide a conformal recipient luminophoric medium on the semiconductor light emitting device.

According to yet additional embodiments of the present invention, packaged light emitting devices are provided that include a submount having an LED mounted thereon and a recipient luminophoric medium conformally coated on the LED and on the submount. The recipient luminophoric medium may include a first broad-spectrum luminescent material that down-converts a first portion of the radiation emitted by the LED to radiation having a peak wavelength in a first color range (e.g., the yellow color range) and a first narrow-spectrum luminescent material.

In some embodiments, the submount may include at least one reflective portion, and the recipient luminophoric medium may be coated on the at least one reflective portion. The recipient luminophoric medium may also include a second broad-spectrum luminescent material that down-converts a second portion of the radiation emitted by the LED to radiation having a peak wavelength in, for example, the red color range.

The narrow-spectrum luminescent material may down-convert a third portion of the radiation emitted by the LED to radiation having a peak wavelength in the red, cyan or green color ranges. In some embodiments, the packaged light emitting device may include at least two blue LEDs mounted on the submount, and the recipient luminophoric medium may be conformally coated to cover the two blue LEDs and a portion of the submount that between the two blue LEDs.

DETAILED DESCRIPTION

Figure 1:
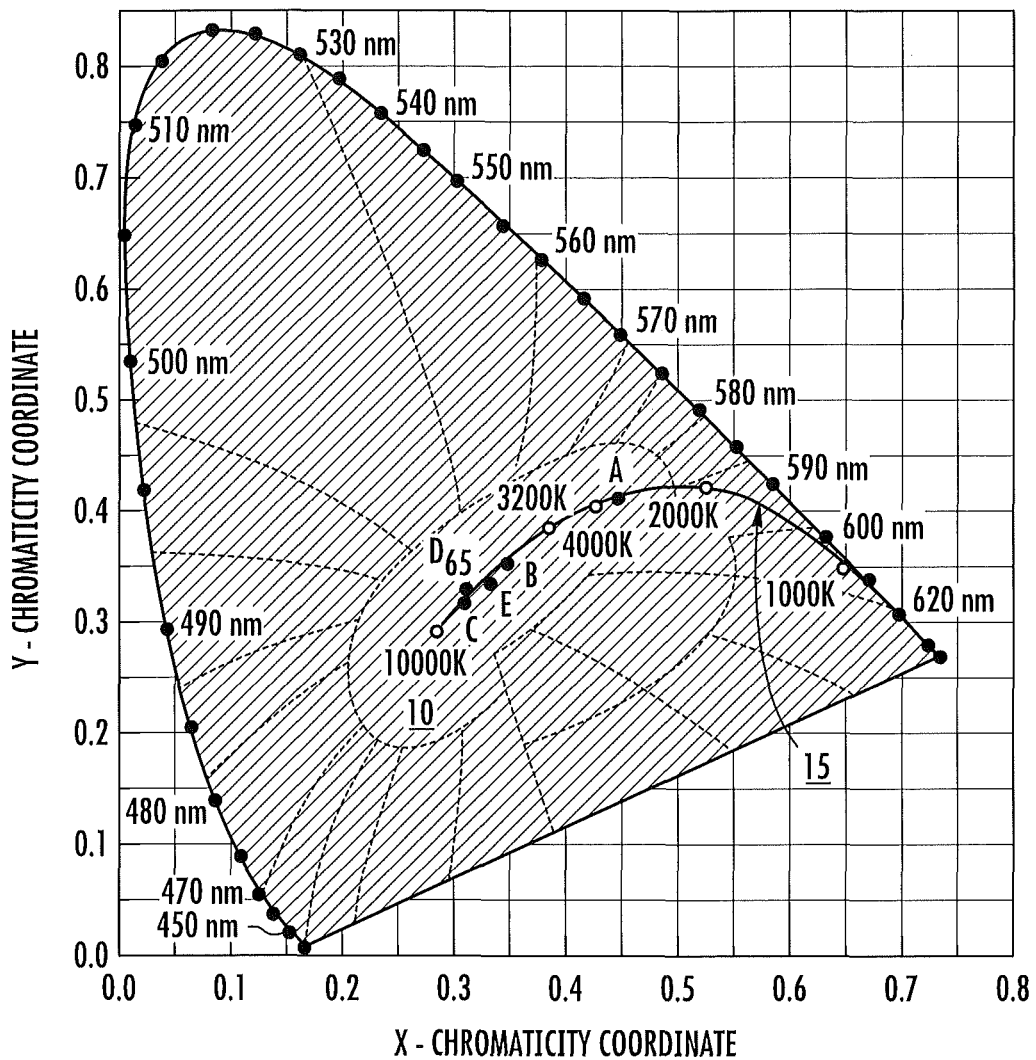
FIG. 1 is a graph of a 1931 CIE Chromaticity Diagram illustrating the location of the planckian locus.

The present invention is directed to recipient luminophoric mediums that include at least one narrow-spectrum luminescent material, and to semiconductor light emitting devices that include such recipient luminophoric mediums. Methods of fabricating the semiconductor light emitting devices according to embodiments of the present invention are also disclosed herein.

As used herein, the term "semiconductor light emitting device" may include LEDs, laser diodes and any other light emitting devices that includes one or more semiconductor layers, as well as packaged lamps, bulbs, fixtures and the like which include such devices. The semiconductor layers included in these devices may include silicon, silicon carbide, gallium nitride and/or other semiconductor materials, an optional semiconductor or non-semiconductor substrate, and one or more contact layers which may include metal and/or other conductive materials. The expression "light emitting device," as used herein, is not limited, except that it be a device that is capable of emitting light.

Semiconductor light emitting devices according to embodiments of the invention may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the substrate in a so-called "flip chip" orientation. Semiconductor light emitting devices according to embodiments of the present invention include both vertical devices with a cathode contact on one side of the LED, and an anode contact on an opposite side of the LED and devices in which both contacts are on the same side of the device. Some embodiments of the present invention may use semiconductor light emitting devices, device packages, fixtures, luminescent materials, power supplies and/or control elements such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272. The design and fabrication of semiconductor light emitting devices are well known to those skilled in the art, and hence further description thereof will be omitted.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

It is further known that a binary combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI"). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero. Light sources for general illumination applications with a CRI of less than 50 are generally considered very poor and are typically only used in applications where economic issues preclude other alternatives. Light sources with a CRI value between 70 and 80 have application for general illumination where the colors of objects are not important. For some general interior illumination, a CRI value of greater than 80 is acceptable. A light source with color coordinates within 4 MacAdam step ellipses of the planckian locus 15 and a CRI value that exceeds 85 is more suitable for general illumination purposes. Light sources with CRI values of more than 90 provide greater color quality.

For backlight, general illumination and various other applications, it is often desirable to provide a lighting source that generates white light having a relatively high CRI, so that objects illuminated by the lighting source may appear to have more natural coloring to the human eye. Accordingly, such lighting sources may typically include an array of semiconductor lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

The present disclosure describes various recipient luminophoric mediums that have luminescent materials that have peak emission wavelengths in various color ranges. For purposes of this disclosure, the various color ranges described herein are defined as follows:

Blue color range=450-479 nm
Cyan color range=480-510 nm
Green color range=511-549 nm
Yellow/Orange color range=550-604 nm
Red color range=605-700 nm As noted above, a recipient luminophoric medium that includes, for example, a yellow phosphor, may be used in conjunction with a blue LED to provide a white light emitting device. Such a device typically emits cool white light that often has a lower CRI value. In order to increase the "warmth" of the emitted white light and/or to improve the CRI of the device, red phosphor particles may be added to the recipient luminophoric medium. Such red phosphors can be classified into two categories, namely stable and unstable phosphors. Generally speaking, the unstable phosphors are BOSE, sulfides and other non-nitride phosphors, while the stable red phosphors are nitride-based phosphors. The nitride-based red phosphors are typically characterized by broad emission spectrums (e.g., FWHM widths of greater than 80 nm) and relatively high peak wavelengths (e.g., between about 630 nm and about 660 nm).

The above-described nitride-based red phosphors may be used in conjunction with, for example, green or yellow phosphors and a blue LED to provide a warm white LED lamp that has a high CRI value, such as a CRI value that exceeds 90. However, such LEDs tend to be relatively inefficient. For example, typical conventional warm white LEDs (e.g., correlated color temperatures of between 2,700 K and 4,100 K) that have recipient luminophoric mediums that include the above-described nitride-based red phosphors may have, for example, a Lumen equivalent output of about 270-320 Lum/W-Optical. As known to those of skill in the art, the "Lumen equivalent output" or "Lumen Equivalent Ratio LER" of a light emitting device refers to the number of Lumens of light output by the device, as perceived by the human eye, per Watt of optical power emitted by the light source.

Other nitride-based red phosphors are available that have lower peak wavelengths (e.g., between about 610 nm and about 629 nm) and generally narrower emission spectrum (e.g., FWHM widths of between 60 nm and 80 nm). Herein, phosphors or other luminescent materials that have FWHM widths of greater than 60 nm are referred to as "broad-spectrum" phosphors or luminescent materials. Pursuant to embodiments of the present invention, it has been discovered that white LEDs having significantly improved Lumen equivalent outputs may be provided by using these lower wavelength (610 to 629 nm) broad-spectrum red phosphors in place of the above-described conventional broad-spectrum red phosphors that have higher wavelengths (630 to 660 nm) and typically broader emission spectra (FWHM widths that exceed 80 nm). In particular, the lower Lumen equivalent output of the above-described conventional warm white LEDs may in part be attributed to the high Stoke's shift of these devices (the Stoke's shift refers to the difference between the peak wavelength of the light absorbed by the phosphor and the peak wavelength of the light emitted by the phosphor). These high Stoke's shifts can limit the conversion efficiency of the red phosphor (i.e., the percentage of blue light that is absorbed by the phosphor that is actually converted to red light is relatively low), resulting in the decreased Lumen equivalent output. Additionally, the human eye does not perceive light well that has wavelengths that exceed about 630 or 640 nm, and hence light emitted in the higher portion of the red color range does not significantly contribute to the Lumen equivalent output of a device. As many conventional nitride-based red phosphors have peak wavelengths that exceed 630 or 640 nm, at least half of the emission spectrum of such phosphors provides little overall contribution to the Lumen equivalent output of a light emitting device that includes such phosphors.

By replacing the above-described conventional broad-spectrum red phosphors with red phosphors that have lower peak wavelengths and more compact emission spectra, the Stoke's shift can be reduced and the percentage of the emission spectra that is well-perceived by the human eye can be increased significantly. As a result, by switching to the 610 to 629 nm peak wavelength red phosphors, the Lumen equivalent output of a white LED that includes such phosphors can be increased by, for example, about 30%. Thus, using such a phosphor (along with, for example, a yellow phosphor and a blue LED), a warm white semiconductor light emitting device (e.g., correlated color temperature between 2,700 K and 4,100 K) may be provided that has an overall Lumen equivalent output of, for example, 350-360 Lum/W-Optical or more.

Unfortunately, when a light emitting device that includes a blue LED and a recipient luminophoric medium that includes a conventional broad-spectrum red phosphor is modified to replace the conventional red phosphor with a lower peak wavelength red phosphor (i.e., one having a peak wavelength closer to the green color spectrum), the CRI of the light emitting device tends to be reduced due to the reduced contribution of spectral energy in the longer wavelength portions of the red color band. However, it has also been discovered that the CRI values of such a light emitting device can be partially or completely recovered by adding one or more "narrow-spectrum" luminescent materials to the recipient luminophoric medium. Herein, a "narrow-spectrum" luminescent material refers to a luminescent material that has an emission spectrum having a FWHM width of less than 60 nm. The addition of a narrow-spectrum luminescent material such as, for example, red quantum dots that have an emission spectrum with a peak wavelength of 618 nm and a FWHM width of about 30 nm may significantly increase the CRI value of the light emitting device without significantly degrading its Lumen equivalent output. Moreover, in some embodiments, the narrow-spectrum luminescent material may have an extremely compact emission spectrum such as, for example, an emission spectrum having a FWHM width of less than 20 nm. For example, f-to-f transition phosphors may have emission spectrum with FWHM widths of less than 10 nm. Herein narrow-spectrum luminescent materials that have emission spectrum with a FWHM width of less than 20 nm are referred to as "line-emitter luminescent materials."

Thus, pursuant to some embodiments of the present invention, semiconductor light emitting devices are provided that emit warm white light having high CRI values with a relatively high Lumen equivalent output. In some embodiments, these light emitting devices may emit light having CRI values that exceed 90, and may have a color point that is within 7 MacAdam ellipses of the black-body locus on a 1931 CIE chromaticity diagram, a correlated color temperature of between about 2500 K and about 4500 K and a Lumen equivalent output of at least 350 Lum/W-Optical. In other embodiments, semiconductor light emitting devices are provided that emit light having CRI values that exceed 90 and that have a color point that is between 0.385 and 0.485 ccx and 0.380 and 0.435 ccy on the 1931 CIE chromaticity diagram, a correlated color temperature of between about 2500 K and about 4500 K and a Lumen equivalent output of at least 350 Lum/W-Optical. As noted above, the semiconductor light emitting devices according to embodiments of the present invention may achieve these high CRI and Lumen equivalent output values while providing warm white light.

Figure 2:
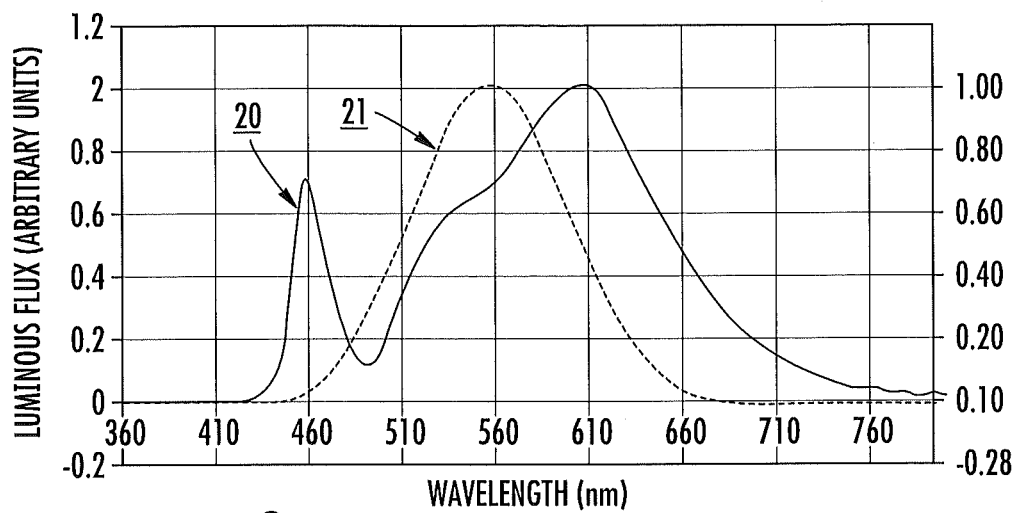
FIG. 2 is a graph illustrating the intensity of the radiation emitted by a conventional warm white semiconductor lighting device as a function of wavelength.
Figure 3:
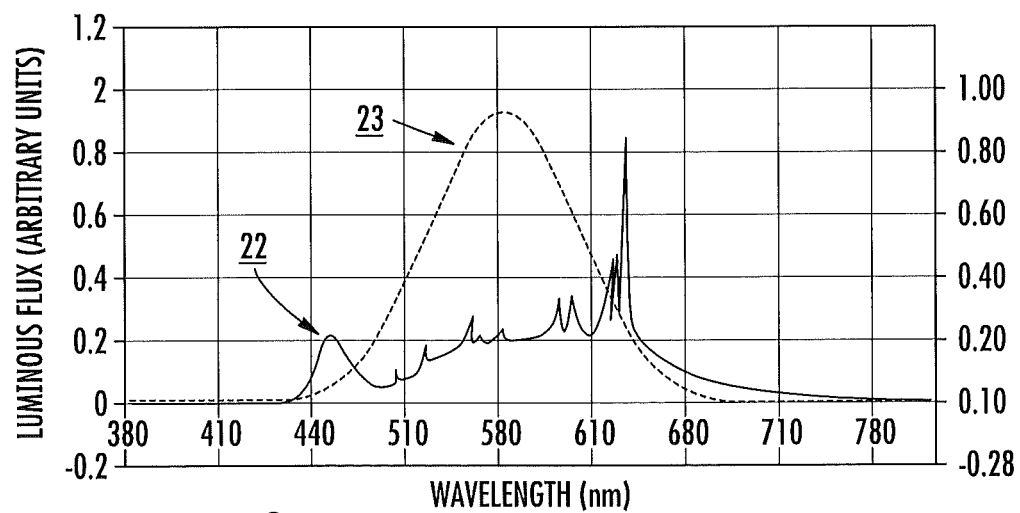
FIG. 3 is a graph illustrating the intensity of the radiation emitted by a warm white semiconductor light emitting device according to certain embodiments of the present invention as a function of wavelength.
Figure 4:
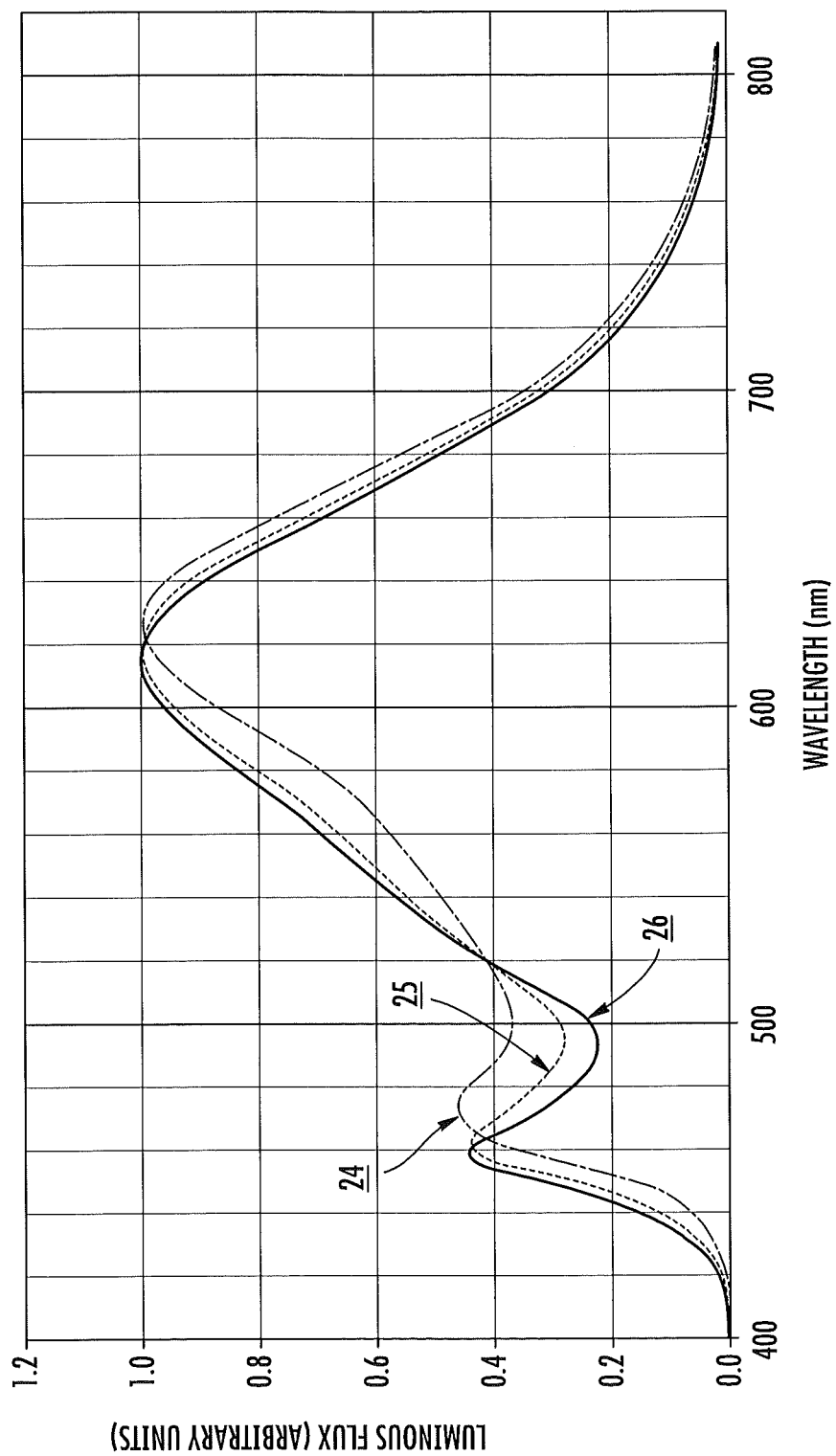
FIG. 4 is a graph illustrating the intensity of the radiation emitted by semiconductor light emitting device which may be modified according to embodiments of the present invention.

Example embodiments of the present invention will now be discussed with reference to FIGS. 2-4. FIG. 2 is a graph illustrating the intensity of the radiation emitted by a conventional semiconductor light emitting device which is provided for comparative purposes. FIG. 3 is a graph illustrating the simulated intensity of the radiation emitted by semiconductor light emitting devices according to certain embodiments of the present invention. FIG. 4 is a graph illustrating the intensity of the radiation emitted by another semiconductor light emitting device which may be modified according to embodiments of the present invention to exhibit improved performance.

Turning first to FIG. 2, it can be seen that the simulated emission spectrum (curve 20) for the conventional semiconductor light emitting device has a first peak in the blue color range and a second peak that extends across the green, yellow/orange and red color ranges. The simulation used to generate curve 20 in FIG. 2 assumed that the semiconductor light emitting device included a blue LED having a peak wavelength of about 460 nm and a recipient luminophoric medium that included a mixture of yellow [YAG:Ce] and red [(Ca$_{1-x}$Sr$_x$)SiAlN$_3$:Eu$^{2+}$] phosphor particles (herein semiconductor light emitting devices that include recipient luminophoric mediums that include both a yellow phosphor or other luminescent material and a red phosphor or other luminescent material are referred to as "yellow/red phosphor" devices). The relative amounts of the yellow and red phosphors were selected to provide a light emitting device having a correlated color temperature of 3,000 K. As can be seen in FIG. 2, the blue light emitted by the LED that passes through the recipient luminophoric medium without conversion generates a narrow peak in the emission spectrum at 460 nm, and the blue light that is converted by the phosphors to yellow, orange or red light generates a broad peak in the emission spectrum that is centered at about 610 nm.

A second curve 21 is also superimposed on the graph of FIG. 2. Curve 21 illustrates the response of the human eye to light emitted at each wavelength across the visible spectrum. As shown in curve 21, this response peaks at about 555 nm (which is about at the intersection of the green and yellow color ranges), and drops off relatively quickly in both directions from this peak. As shown in FIG. 2, a significant portion of the broad peak of curve 20 falls at wavelengths where the response of the human eye to light is relatively low. As a result, the light that is emitted at such wavelengths provides relatively little contribution to the Lumen equivalent output of the device.

We next turn to FIG. 3, which is a graph having a curve 22 that illustrates the simulated intensity of the radiation emitted by a yellow/red phosphor semiconductor light emitting device according to certain embodiments of the present invention. The device that was simulated to generate curve 22 comprises a blue LED (peak wavelength of 460 nm) that has a recipient luminophoric medium that is similar to the recipient luminophoric medium included in the device simulated in curve 20 of FIG. 2. However, 25% of the (Ca$_{1-x}$Sr$_x$)SiAlN$_3$:Eu$^{2+}$ red phosphor that was included in the device used to generate curve 20 of FIG. 2 was replaced with a narrow-spectrum red luminescent material (which could be, for example, a Y2O2S:Eu3+, (Y,M)VO4:Eu3+, Cd(Se,S) or Zn(Se,S) quantum dots an "f-to-f transition" phosphor or a transition metal such as Mn2+) in order to generate curve 22 of FIG. 3.

As shown in FIG. 3, the emission spectrum (curve 22) of the red/yellow phosphor semiconductor light emitting device according to embodiments of the present invention has one broad peak, two substantial narrow peaks, and several additional small narrow peaks. In particular, the emission spectrum has a first narrow peak at about 460 nm that results from the unconverted blue light emitted by the LED, a second lower and broader peak that extends across the green, yellow, and much of the red color ranges, and a third narrow peak at about 620 nm that reflects the emission of the narrow-spectrum f-to-f phosphor. Curve 23 on the graph of FIG. 3 once again illustrates the response of the human eye to light emitted at each wavelength across the visible spectrum. As shown in FIG. 3, the emission spectrum of curve 22 better falls within the human eye response represented by curve 23, and hence the device with the emission spectrum of curve 22 may have an improved Lumen equivalent output.

The conventional yellow/red phosphor semiconductor light emitting device that was used to generate curve 20 on the graph of FIG. 2 has a simulated Lumen equivalent output of 322 Lum/W-Optical and a simulated CRI of 80.1. In contrast, the yellow/red phosphor device according to embodiments of the present invention that was used to generate curve 22 on the graph of FIG. 3 has a simulated Lumen equivalent output of 330 Lum/W-Optical and a CRI of 90. These simulations demonstrate that yellow/red phosphor semiconductor light emitting device according to embodiments of the present invention may provide both improved light output and color rendering as compared to conventional yellow/red phosphor semiconductor light emitting devices.

Single-die semiconductor light emitting devices are also currently available that comprise an LED that emits radiation having a peak wavelength in the blue color range and a recipient luminophoric medium that includes a mixture of green and red phosphor particles. These conventional devices may produce warm white light having a significantly higher CRI values such as, for example, CRI values between 84-94. Herein, single-die semiconductor light emitting devices that include recipient luminophoric mediums that include both green and red phosphors (or other luminescent materials) are referred to as "green/red phosphor" devices. While intuitively it might appear that green/red phosphor devices would also exhibit high Lumen equivalent output values, a higher ratio of red-to-green phosphor particles is required to design a green/red phosphor device that has a warm white color point than is the ratio of red-to-yellow phosphor particles that is required to design a yellow/red phosphor device having the same warm white color point. As the Lumen equivalent output of the light emitted in the red color range is significantly lower than the Lumen equivalent output of light emitted in the yellow or green color ranges, the larger amount of the emission that is in the red color range in the green/red phosphor device (due to the higher percentage of red phosphor particles) may result in a significantly lower Lumen equivalent output for green/red devices (e.g., 25-30% or more) as compared to comparable yellow/red phosphor devices. Thus, while green/red phosphor devices may provide high CRI values, they tend to exhibit relatively poor Lumen equivalent outputs.

In order to provide semiconductor light emitting devices having relatively high CRI values with less reduction in Lumen equivalent output, "green/yellow/red phosphor devices" have been proposed that include, for example, a blue LED and a recipient luminophoric medium that includes a mixture of broad-spectrum green, yellow and red phosphor particles (or other luminescent materials). Such green/yellow/red phosphor devices are disclosed, for example, in co-pending U.S. patent application Ser. Nos. 12/720,390 and 13/017,983, each of which are assigned to the assignee of the present application. In some embodiments of these devices, the yellow luminescent material may comprise a YAG:Ce phosphor and the red luminescent material may comprise a $(Ca_{1-x}Sr_x)SiAlN_3:Eu^{2+}$ red phosphor (or Sr2Si5N8:Eu2+). The green luminescent material may comprise a broad-spectrum luminescent material that has a FWHM emission spectrum that falls into at least part of the cyan color range. In some embodiments, the green luminescent material may comprise a LuAG:Ce phosphor (i.e., cerium doped LuAG), and may have a peak emission wavelength of between 535 and 545 nm, and a FWHM bandwidth of between about 110-115 nm. As such, the FWHM bandwidth of LuAG:Ce phosphors may extend across the entire cyan color range.

FIG. 4 is a graph illustrating the intensity of the radiation emitted by several of the green/yellow/red phosphor semiconductor light emitting devices that are disclosed in co-pending U.S. patent application Ser. No. 13/017,983. As shown in FIG. 4, the emission spectrum of each device (which are shown by curves 24, 25 and 26) has a first, narrow peak in the blue color range that results from the unconverted blue light emitted by the LED, and a second broader peak that extends across the green, yellow and red color ranges. Moreover, by using green phosphors that have significant contribution across the cyan color region and/or by using blue LEDs that have a somewhat longer wavelength, the dip in the emission spectrum that might otherwise occur in the cyan region is reduced somewhat with the devices of curves 24 and 25 and largely avoided in the case of curve 26. As a result, the semiconductor light emitting device that was used to generate curve 26 in the graph of FIG. 4 exhibited a CRI value of 91.4.

Pursuant to further embodiments of the present invention, green/yellow/red phosphor semiconductor light emitting devices may be provided that replace some of the broad-spectrum red phosphor that was included in the devices that were used to generate curves 24-26 in the graph of FIG. 4 with a narrow-spectrum red luminescent material such as, for example Y2O2S:Eu3+ or Cd(Se,S) or Zn(Se,S) quantum dots. It is expected that the above-described green/yellow/red phosphor semiconductor light emitting devices that include both a broad-spectrum and a narrow-spectrum luminescent material that emits light in the red color range will exhibit even further improved CRI. In still further embodiments of the present invention, the $(Ca_{1-x}Sr_x)SiAlN_3:Eu^{2+}$ phosphor may be replaced with a Y2O3:Eu3+, Y2O2S:Eu3+, (Y,Bi)VO4:Eu3+ phosphor along with a narrow-spectrum red luminescent material such as, for example Zn(Se,S) or Cd(S,Se) quantum dots.

It will be appreciated that the present invention is not limited to the exemplary semiconductor light emitting devices discussed above with reference to FIGS. 2-4. For example, other narrow-spectrum red luminescent materials may be used. The peak wavelength and/or FWHM width of the narrow-spectrum red luminescent materials could be varied, and/or more than one narrow-spectrum red luminescent materials could be used. For example, several narrow-spectrum red luminescent materials could be used that are spread across the red color range. It will also be appreciated that green, yellow and/or red broad-spectrum luminescent materials could be used other than the exemplary phosphors disclosed in the above examples.

While the above-described embodiments of the present invention use narrow-spectrum red luminescent materials to provide light emitting devices having, for example, improved CRI values, it will be appreciated that the present invention is not limited to adding red narrow-spectrum luminescent materials to a recipient luminophoric medium. By way of example, pursuant to further embodiments of the present invention, semiconductor light emitting devices are provided that include narrow-spectrum luminescent materials that emit light in, for example, the cyan, green or blue color ranges. The inclusion of such narrow-spectrum luminescent materials in color ranges other than the red color range may, for example, provide devices having improved CRI values.

In one such embodiment, a blue LED is provided that has a recipient luminophoric medium that includes a broad-spectrum yellow luminescent material (e.g., YAG:Ce), a broad-spectrum red luminescent material (e.g., $(Ca_{1-x}Sr_x)SiAlN_3$: $Eu^{2+}$) and a narrow-spectrum cyan luminescent material (e.g., BaSi2O2N2:Eu2+, or Cd(Se,S) or Zn(Se,S) quantum dots). The narrow-spectrum cyan luminescent material may provide a device having an improved CRI value, as it serves to fill-in a gap in the emission spectrum between the blue peak generated by the blue LED and the yellow peak generated by the YAG:Ce phosphor. In another embodiment, a blue LED is provided that has a recipient luminophoric medium that includes a broad-spectrum green luminescent material (e.g., LuAG:Ce), a broad-spectrum yellow luminescent material (e.g., YAG:Ce), a broad-spectrum red luminescent material (e.g., $(Ca_{1-x}Sr_x)SiAlN_3:Eu^{2+}$) and a narrow-spectrum cyan luminescent material (e.g., Ba2Si2O2N2:Eu2+ or (Sr,Ba,Ca)2SiO4:Eu2+). In this embodiment, the narrow-spectrum cyan luminescent material is added in order to reduce the amount of the broad-spectrum green luminescent material included in the recipient luminophoric medium. The narrow-spectrum cyan luminescent material may provide a device having an improved CRI value, as it can more effectively fill in the gap in the emission spectrum in the cyan region than can the broad-spectrum green luminescent material. Some broad-spectrum green luminescent material is included in the device to prevent reduction in the CRI value based on insufficient spectral contribution in the green color range and to reduce the CRI sensitivity to blue LED wavelength variation.

In still further embodiments, light emitting devices are provided that include a blue LED that has a recipient luminophoric medium that includes a broad-spectrum green luminescent material (e.g., LuAG:Ce), a broad-spectrum yellow luminescent material (e.g., YAG:Ce), a broad-spectrum red luminescent material (e.g., $(Ca_{1-x}Sr_x)SiAlN_3:Eu^{2+}$) and a narrow-spectrum green luminescent material (e.g., Cd(Se,S), Zn(Se,S), SrSi2O2N2:Eu2+ or BASN:Eu2+). The narrow-spectrum green luminescent material may provide a device having an improved CRI value, as it serves to fill-in a gap in the emission spectrum between the blue peak generated by the blue LED and the yellow peak generated by the broad-spectrum yellow luminescent material.

According to still further embodiments of the present invention, narrow-spectrum luminescent materials in multiple different color ranges may be used to provide a light emitting device having increased Lumen equivalent output and/or improved CRI. For example, the recipient luminophoric medium of the yellow/red phosphor device according to embodiments of the present invention that is discussed above with respect to FIG. 3 may be further modified to include a narrow-spectrum cyan and/or green luminescent material (in addition to the narrow-spectrum red luminescent material) to provide a device having further improved CRI. Likewise, the green/yellow/red phosphor device according to embodiments of the present invention that is discussed above with respect to FIG. 4 (that includes a narrow-spectrum red luminescent material) may be further modified to also include a narrow-spectrum cyan and/or green luminescent material to further improve the CRI of the device. Likewise, the devices described above that include cyan light emitting luminous materials could be modified to also include narrow-spectrum green luminous materials in the recipient luminophoric mediums thereof.

It will likewise be appreciated that narrow-spectrum luminescent materials that emit light in color ranges other than the red, cyan and green ranges may also be used. For example, the blue LEDs that are included in each of the above-discussed embodiments could be replaced by a violet or ultraviolet LED. In such embodiments, a narrow-spectrum luminescent materials that emits light in the blue range may be added to the recipient luminophoric medium to provide a warm white LED having a high CRI and Lumen equivalent output values. Numerous other combinations of LEDs, broad-spectrum luminescent materials and narrow-spectrum luminescent materials are possible pursuant to still further embodiments of the present invention, and all combinations of LEDs (e.g., blue, violet and ultraviolet), broad-spectrum luminescent materials and narrow-spectrum luminescent materials that are included in each of the above-described embodiments are considered to be within the scope of the present invention.

In still further embodiments of the present invention, semiconductor light emitting devices are provided that include two or more LEDs and a recipient luminophoric medium that includes at least one narrow-spectrum luminescent material. By way of example, the semiconductor light emitting device may include both one or more blue LEDs and one or more red LEDs, along with a broad-spectrum yellow or green luminescent material. The device may further include one or more narrow-spectrum luminescent materials that emit light in, for example, the cyan, green or red color ranges.

As discussed above, green, yellow and/or red light emitting broad-spectrum luminescent materials may be used in the recipient luminophoric mediums of light emitting devices according to various embodiments of the present invention. While the green broad-spectrum luminescent material has primarily been discussed above with respect to LuAG:Ce, other suitable green light emitting broad-spectrum luminescent materials may be used including, for example, $Sr_6P_5BO_{20}$:Eu; $MSi_2O_2N_2$:$Eu^{2+}$; and Zinc Sulfide:Ag with (Zn,Cd)S:Cu:Al, or other combinations. While the primary example of a yellow light emitting broad-spectrum luminescent material described above is YAG:Ce, it will be appreciated that many other suitable yellow light emitting luminescent materials are available, including, for example, $Tb_{3-x}RE_xO_{12}$:Ce(TAG) where RE=Y, Gd, La, Lu; and $Sr_{2-x-y}Ba_x$-$Ca_ySiO_4$:Eu. While the primary example of a red light emitting broad-spectrum luminescent material described above is $(Ca_{1-x}Sr_x)SiAlN_3$:$Eu^{2+}$, other red (or orange) light emitting luminescent materials may be used including, for example, $Lu_2O_3$:$Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3$:$Pr^{3+}$, $Ga^{3+}$; $CaAlSiN_3$:$Eu^{2+}$; and/or $Sr_2Si_5N_8$:$Eu^{2+}$.

As is discussed above, in some embodiments, both a LuAG:Ce phosphor and a YAG:Ce phosphor may be provided in the recipient luminophoric medium. In such devices, these two phosphors could be grown together in a single cerium-doped structure that includes lutetium, yttrium, aluminum and oxygen. For example, the LuAG:Ce phosphor and the YAG:Ce could be implemented together as a $Lu_{1-x}Y_xAl_5O_{12}$:Ce material. Such a material would act as both a first phosphor that emits light like a LuAG:Ce phosphor and a second phosphor that emits light like a YAG:Ce phosphor (which would provide a combined spectra having a peak between the peak wavelength of the LuAG:Ce phosphor and the peak wavelength of the YAG:Ce phosphor). Thus, it will be appreciated that any of the recipient luminophoric mediums discussed herein that include first and second luminescent materials may be provided, for example, by (1) mixing or growing the first and second luminescent materials together and then incorporating them into the recipient luminophoric medium, (2) providing the first and second luminescent materials separately and then incorporating them into the recipient luminophoric medium or (3) providing the first and second luminescent materials in separate layers or mediums that together comprise the recipient luminophoric medium.

Based on the above discussion, it will be appreciated that embodiments of the present invention provide semiconductor light emitting devices (and related recipient luminophoric mediums) that may include one or more narrow-spectrum luminescent materials. FIGS. 5A-5F are diagrams illustrating various semiconductor light emitting devices according to embodiments of the present invention that include recipient luminophoric mediums having one or more narrow-spectrum luminescent materials. It will be appreciated that FIGS. 5A-5F are schematic in nature, and are not intended to be limiting. For example, the recipient luminophoric mediums depicted in FIGS. 5A-5F may comprise a single layer or multiple layers, and the luminescent materials that are included in each layer may be altered from what is shown in the figures (e.g., broad-spectrum and narrow-spectrum luminescent materials may be mixed in the same layer). Likewise, one or more of the layers of the recipient luminophoric mediums may not extend to surround side surfaces of the respective LEDs that they receive light from, and may not even cover an entire top (or other) surface of such LEDs. As another example, the recipient luminophoric mediums need not be coated directly on the respective LEDs, but instead need only be arranged to receive light emitted by their respective LEDs.

Figure 5A:
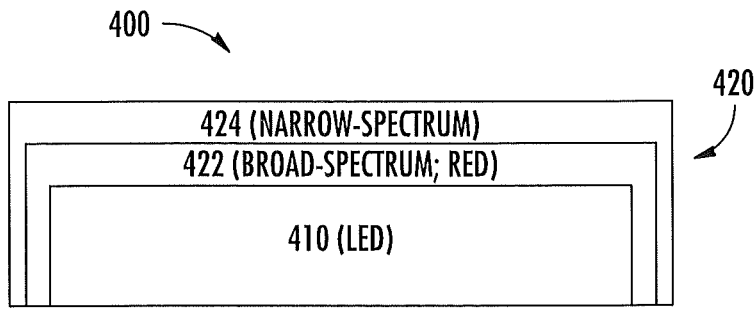
FIGS. 5A-5F are schematic diagrams illustrating various semiconductor light emitting devices according to embodiments of the present invention.

For example, FIG. 5A illustrates a semiconductor light emitting device 400 that includes an LED 410 and a recipient luminophoric medium 420. The LED 410 included in device 400 would typically be a blue LED, although violet, ultraviolet or other LEDs could be used. As shown in FIG. 5A, the recipient luminophoric medium 420 is arranged to receive light emitted by the LED 410 including, for example, light emitted from the sides and top of the LED 410. The recipient luminophoric medium 420 includes (1) at least one broad-spectrum luminescent material 422 that down-converts radiation emitted by the LED to radiation having a peak wavelength in the red color range and (2) at least one narrow-spectrum luminescent material 424. The broad-spectrum luminescent material(s) 422 may contribute emissions across a broad range of wavelengths, while the narrow-spectrum luminescent material(s) 424 may provide emissions at one or more selected narrow ranges of wavelengths that may be designed to enhance the CRI of the combined spectral output while limiting the impact on the luminous efficiency of the device 400. In some embodiments, the narrow-spectrum luminescent material(s) 424 may emit in the red, cyan and/or green color ranges.

Figure 5B:
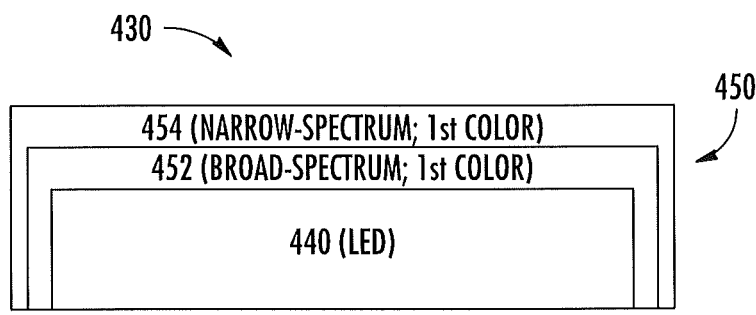

FIG. 5B illustrates another semiconductor light emitting device 430 that includes an LED 440 and a recipient luminophoric medium 450. The LED 440 may be, for example, a blue LED. The recipient luminophoric medium 450 is arranged to receive light emitted by the LED 440. The recipient luminophoric medium 450 includes (1) at least one broad-spectrum luminescent material 452 and (2) at least one narrow-spectrum luminescent material 454 that both down-converts radiation emitted by the LED to radiation having a peak wavelength in the same color range such as, for example, the red color range. Additional broad-spectrum luminescent material(s) 452 and/or narrow-spectrum luminescent material(s) 454 (not shown) may also be included in device 430.

Figure 5C:
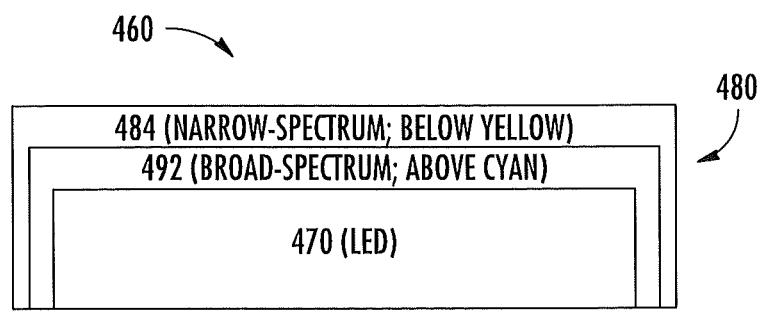

FIG. 5C illustrates another semiconductor light emitting device 460 that includes an LED 470 and a recipient luminophoric medium 480. The LED 470 may be, for example, a blue LED. The recipient luminophoric medium 480 is arranged to receive light emitted by the LED 470. The recipient luminophoric medium 480 includes (1) at least one broad-spectrum luminescent material 482 that down-converts radiation emitted by the LED to radiation having a peak wavelength above the cyan color range and (2) at least one narrow-spectrum luminescent material 484 that down-converts radiation emitted by the LED to radiation having a peak wavelength below the yellow color range such as, for example, the cyan or green color range. Additional broad-spectrum luminescent material(s) 482 and/or narrow-spectrum luminescent material(s) 484 (not shown) may also be included in device 460.

Figure 5D:
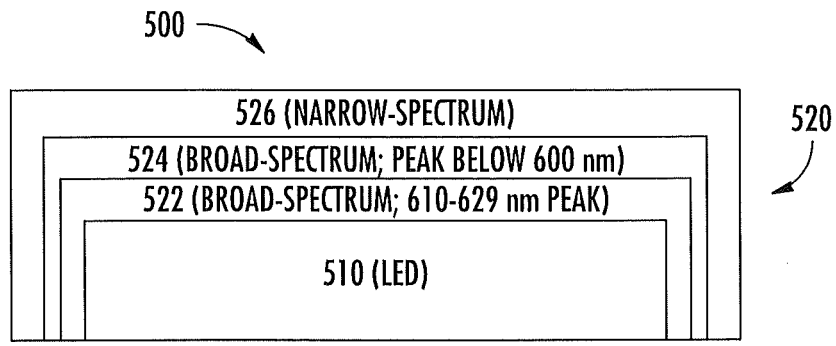

FIG. 5D illustrates another semiconductor light emitting device 500 that includes an LED 510 and a recipient luminophoric medium 520. The LED 510 may be, for example, a blue LED. The recipient luminophoric medium 520 is arranged to receive light emitted by the LED 510. The recipient luminophoric medium 520 includes at least (1) a first broad-spectrum luminescent material 522 that down-converts radiation emitted by the LED to radiation having a peak wavelength that is between 610 and 629 nm, (2) a second broad-spectrum luminescent material 524 that down-converts radiation emitted by the LED to radiation having a peak wavelength below 600 nm and (3) at least one narrow-spectrum luminescent material 526 that down-converts radiation emitted by the LED to radiation having a peak wavelength in one of the cyan, green or red color ranges. Additional broad-spectrum luminescent material(s) 522, 524 and/or narrow-spectrum luminescent material(s) 526 (not shown) may also be included in device 500.

Figure 5E:
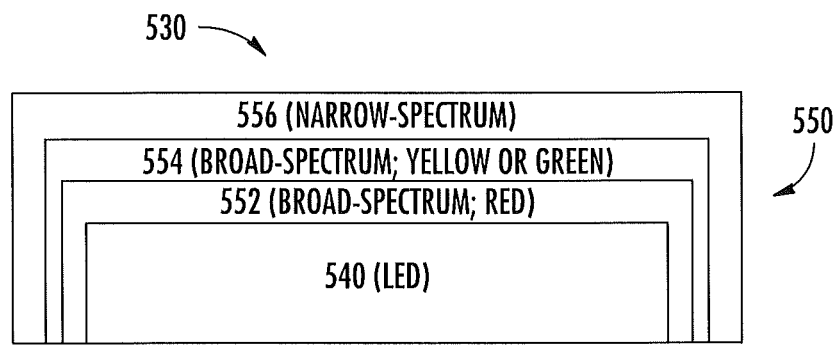

FIG. 5E illustrates another semiconductor light emitting device 530 that includes an LED 540 and a recipient luminophoric medium 550. The LED 540 may be, for example, a blue LED. The recipient luminophoric medium 550 is arranged to receive light emitted by the LED 540. The recipient luminophoric medium 550 includes at least (1) a first broad-spectrum luminescent material 552 that down-converts radiation emitted by the LED to radiation having a peak wavelength in the red color range, (2) a second broad-spectrum luminescent material 554 that down-converts radiation emitted by the LED to radiation having a peak wavelength in a color range other than the red color range such as the yellow color range or the green color range (with a FWHM width that extends into the cyan color range) and (3) at least one narrow-spectrum luminescent material 556 that down-converts radiation emitted by the LED to radiation having a peak wavelength in, for example, one of the cyan, green or red color ranges.

Figure 5F:
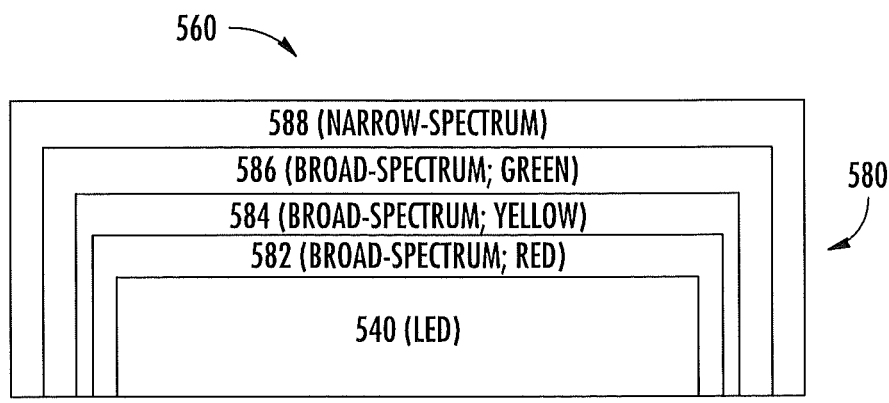

FIG. 5F illustrates another semiconductor light emitting device 560 that includes an LED 570 and a recipient luminophoric medium 580. The LED 570 may be, for example, a blue LED. The recipient luminophoric medium 580 is arranged to receive light emitted by the LED 570. The recipient luminophoric medium 580 includes at least (1) a first broad-spectrum luminescent material 582 that down-converts radiation emitted by the LED to radiation having a peak wavelength in the red color range, (2) a second broad-spectrum luminescent material 584 that down-converts radiation emitted by the LED to radiation having a peak wavelength in the yellow color range, (3) a third broad-spectrum luminescent material 586 that down-converts radiation emitted by the LED to radiation having a peak wavelength in the green color range (with a FWHM width that extends into the cyan color range) and (4) at least one narrow-spectrum luminescent material 588 that down-converts radiation emitted by the LED to radiation having a peak wavelength in, for example, one of the cyan, green or red color ranges.

Figure 6:
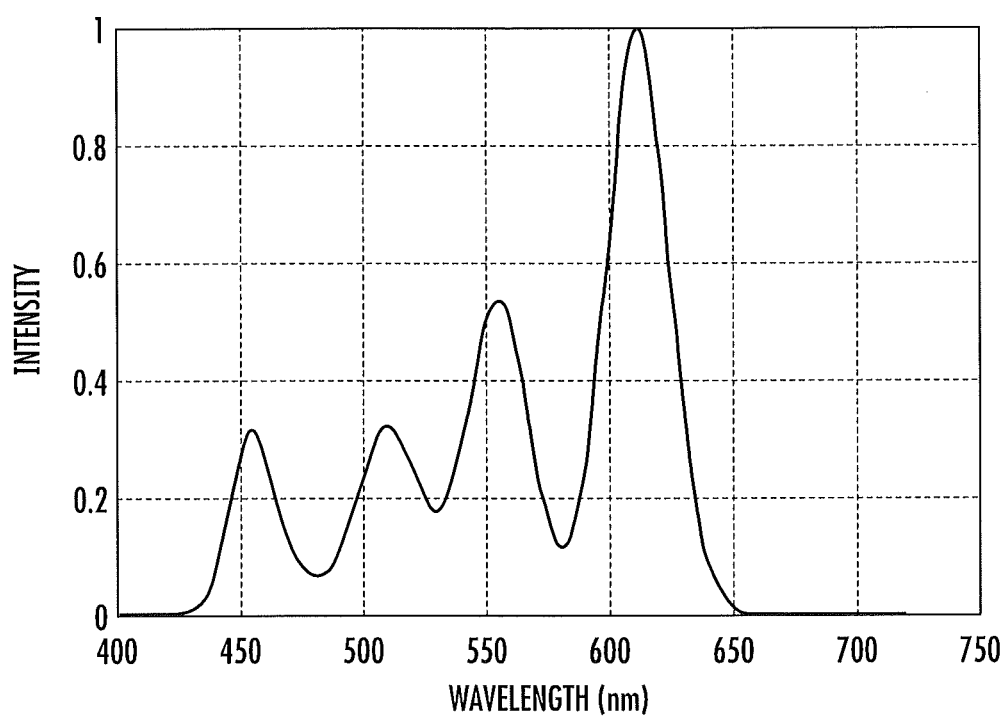
FIG. 6 is a graph illustrating the intensity of the radiation emitted by a warm white semiconductor light emitting device according to further embodiments of the present invention as a function of wavelength.
Figure 7A:
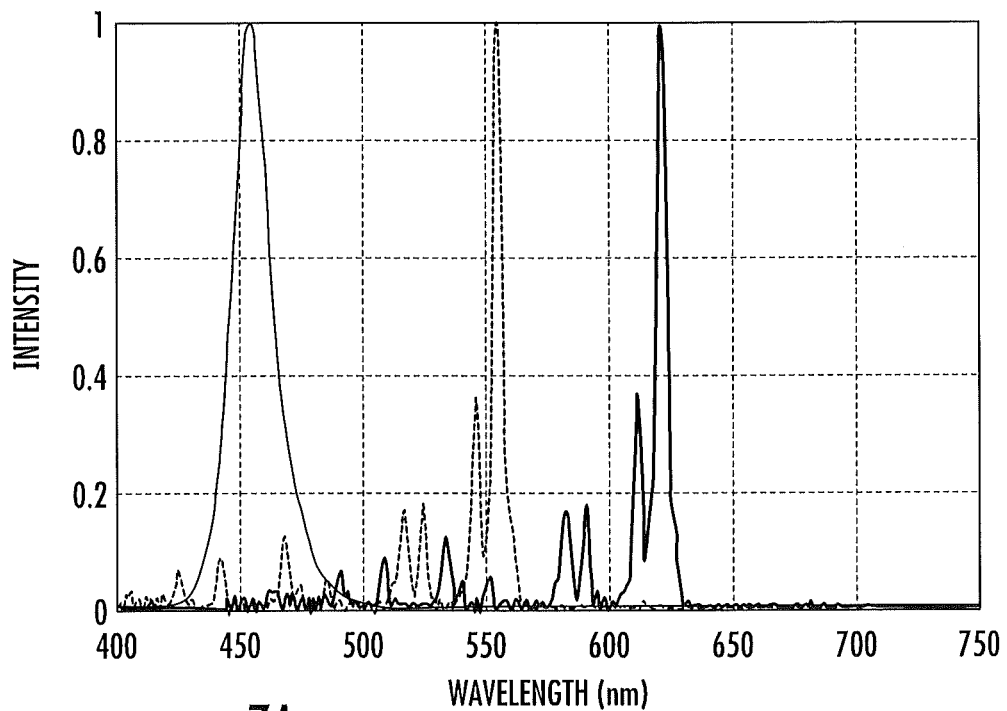
FIGS. 7A-B are graphs illustrating the emission spectra of the radiation emitted by a warm white semiconductor light emitting device according to still further embodiments of the present invention as a function of wavelength.
Figure 7B:
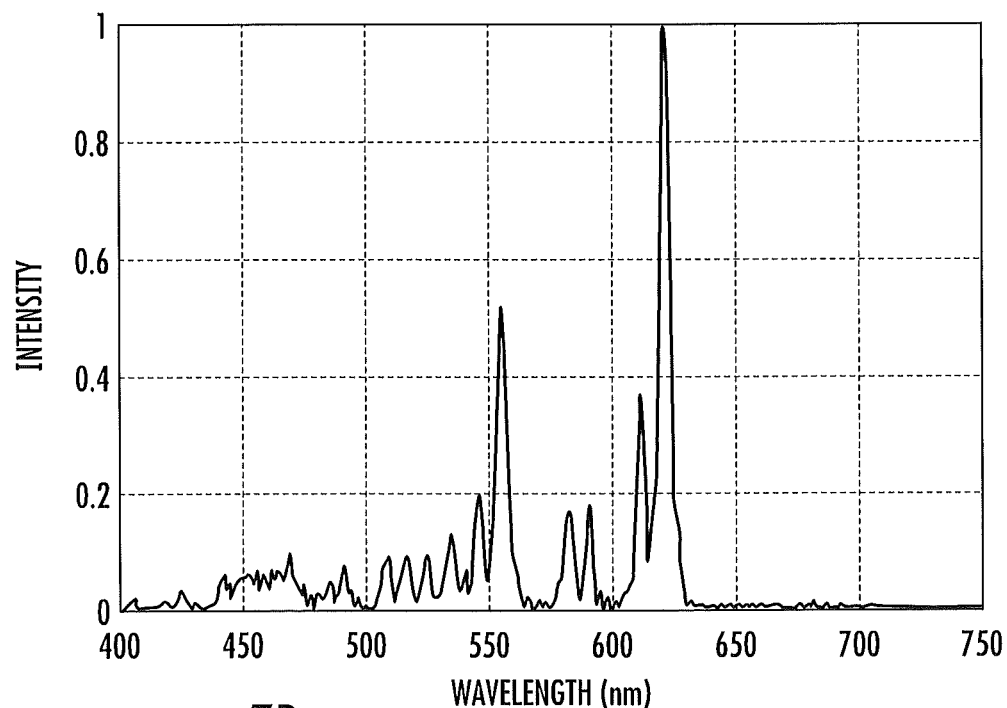

FIGS. 6 and 7A-B are graphs illustrating the simulated emission spectra of various semiconductor light emitting devices according to further embodiments of the present invention.

In particular, FIG. 6 illustrates the simulated emission spectrum of a semiconductor light emitting device according to embodiments of the present invention that includes a blue LED with a peak wavelength of 454 nm, a narrow band cyan emitter having a peak wavelength of 498 nm, a green quantum dot emitter having a FWHM width of 30 nm and a peak wavelength of 555 nm, and a red quantum dot emitter having a FWHM width of 30 nm and a peak wavelength of 615 nm. The device according to embodiments of the present invention that was used to generate the graph of FIG. 6 has a Lumen equivalent output of 381 Lum/W-Optical and a CRI of 90.3. These simulations demonstrate that semiconductor light emitting device according to embodiments of the present invention may provide both improved light output and color rendering as compared to conventional yellow/red phosphor semiconductor light emitting devices.

FIGS. 7A and 7B illustrate the simulated emission spectrum of a semiconductor light emitting device according to further embodiments of the present invention. In particular, FIG. 7A illustrates the emission spectra of each of the individual emitters of the device (i.e., of the blue LED and each luminescent material), while FIG. 7B illustrates the combined emission spectra of both luminescent materials. The semiconductor device that was used in the simulation of FIG. 7 included a blue LED with a dominant wavelength of 450 nm, a hypothetical green line emitter having a peak wavelength of 555 nm, and a hypothetical red line emitter having a peak wavelength of 621 nm. The device used to generate the graph of FIG. 7 has a Lumen equivalent output of 373 Lum/W-Optical and a CRI of 92.6 with a color point at 3000 K on the planckian locus.

While the above examples describe using the recipient luminophoric mediums according to embodiments of the present invention to fabricate warm white light emitting devices, it will be appreciated that they can likewise be used to fabricate cool white light emitting devices or light emitting devices having a desired color point. By way of example, green gallium nitride-based LEDs tend to be much less efficient at converting energy to light than are blue gallium nitride-based LEDs. Thus, blue gallium nitride LEDs may be provided that include a recipient luminophoric medium according to embodiments of the present invention that includes, for example, a high concentration of narrow-spectrum luminescent materials in the green color range that are used to convert a large percentage (e.g., 90% or more) of the blue light emitted by the LED to green light. Thus, it will be appreciated that the techniques according to the present invention may be used to generate light emitting devices having a wide variety of different color points, including non-white color points.

Figure 8A:
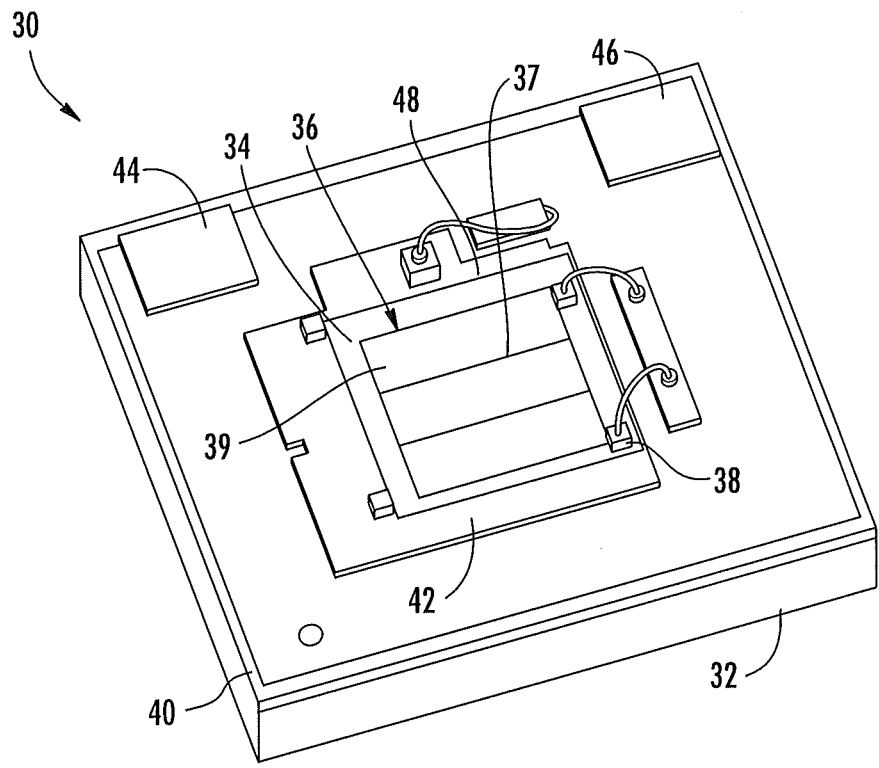
FIGS. 8A-8D are various views of a semiconductor light emitting device according to embodiments of the present invention.
Figure 8B:
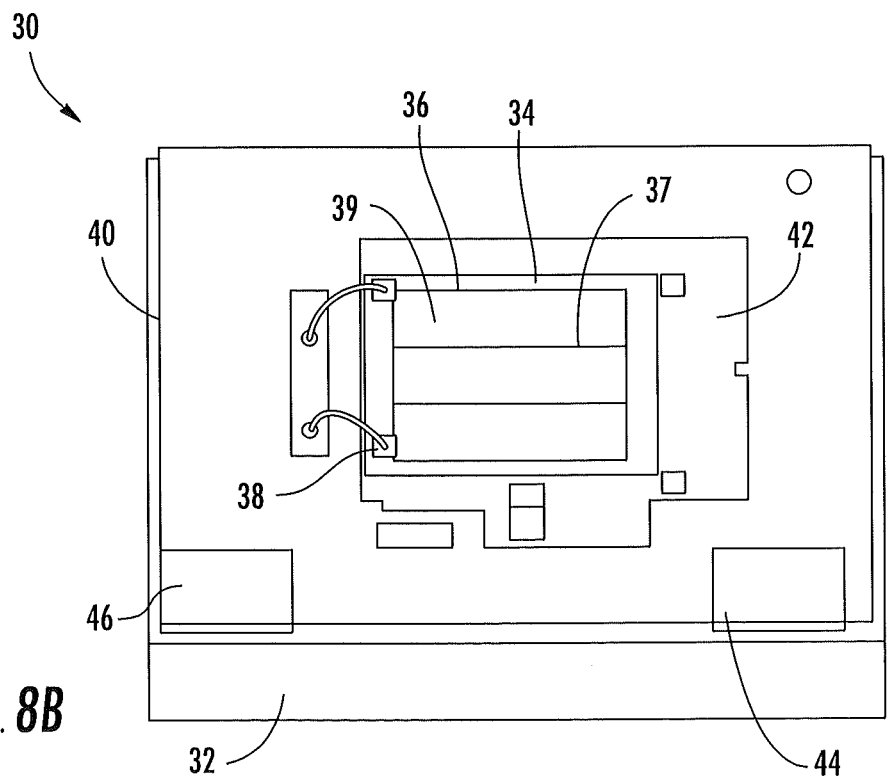
Figure 8C:
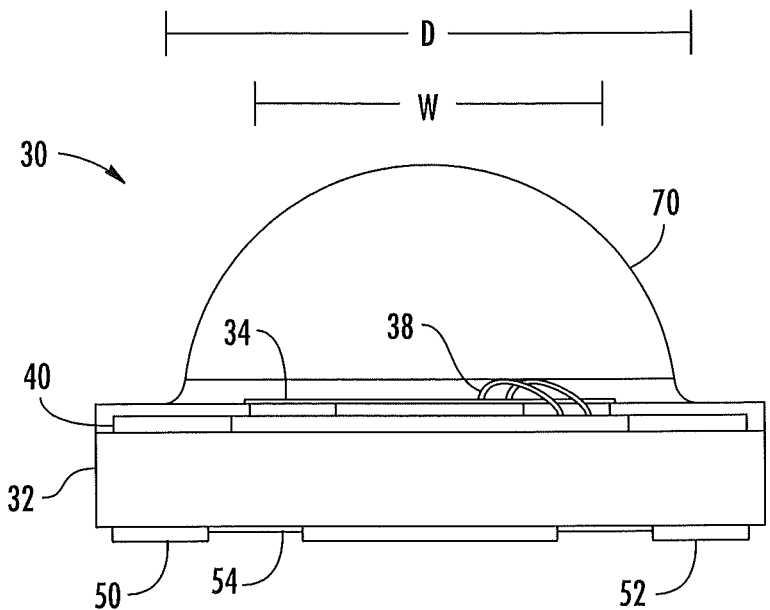
Figure 8D:
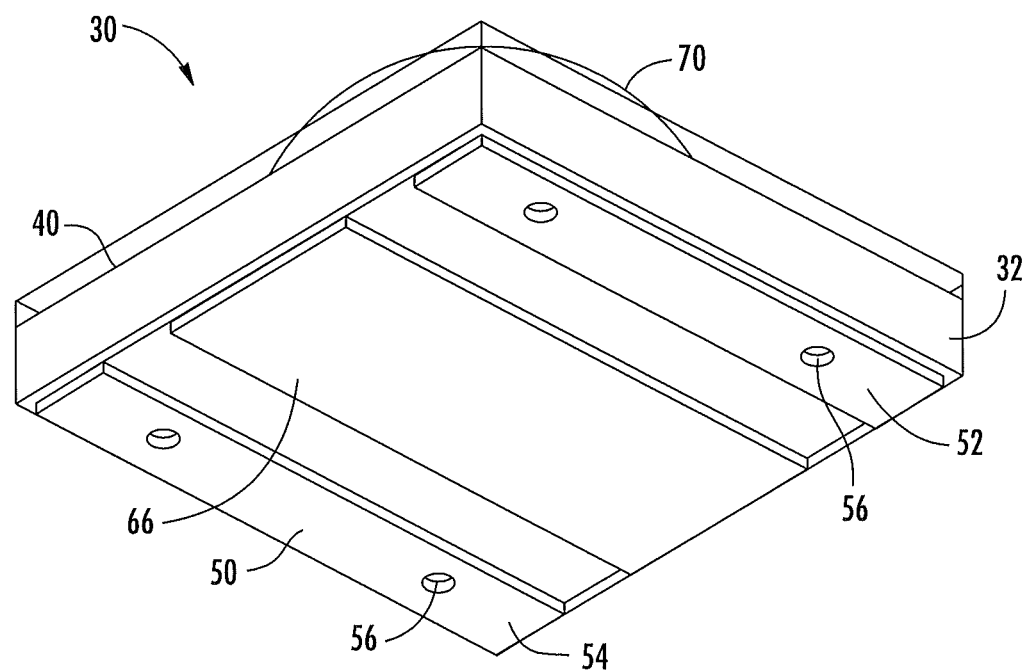

A semiconductor light emitting device 30 will now be described that includes a recipient luminophoric medium according to embodiments of the present invention with reference to FIGS. 8A-8D. The device 30 comprises a packaged LED. FIG. 8A is a perspective view of the device 30 without a lens thereon. FIG. 8B is a perspective view of the device 30 viewed from the opposite side. FIG. 8C is a side view of the device 30 with a lens covering the LED chip. FIG. 8D is a bottom perspective view of the device 30.

As shown in FIG. 8A, the device 30 includes a submount 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 may be an ultraviolet, violet or blue LED that emits radiation with a peak wavelength in a range of about 380 nm to about 475 nm. The LED 34 may include at least one active layer/region sandwiched between oppositely doped epitaxial layers. The LED 34 may be grown on a growth substrate to provide a grown semiconductor wafer, and this wafer may then be singulated into individual LED dies to provide the LED 34. The growth substrate can remain as part of the final singulated LED 34 or can be fully or partially removed.

The LED 34 may include additional layers and elements that are not shown in FIGS. 8A-8D including, for example, nucleation layers, light extraction layers and/or light extraction elements. The oppositely doped layers can comprise multiple layers and sub-layers, as well as super lattice structures and interlayers. The active region can include, for example, single quantum well (SQW), multiple quantum well (MQW), double heterostructure and/or super lattice structures. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may include a conductive current spreading structure 36 on its top surface, as well as one or more contacts 38 that are accessible at its top surface for wire bonding. The current spreading structure 36 and contacts 38 can be made of a conductive material such as Au, Cu, Ni, In, Al, Ag or combinations thereof, conducting oxides and transparent conducting oxides. The current spreading structure 36 may comprise spaced-apart conductive fingers 37 that are arranged to enhance current spreading from the contacts 38 into the top surface of the LED 34. In operation, an electrical signal is applied to the contacts 38 through a wire bond, and the electrical signal spreads through the fingers 37 of the current spreading structure 36 into the LED 34.

The LED 34 may be coated with a recipient luminophoric medium 39 according to any of the embodiments of the present invention that are discussed herein. As discussed above, this recipient luminophoric medium 39 may include multiple luminescent materials that absorb some of the light emitted by the LED 34 and emit light in a different wavelength range in response thereto. The recipient luminophoric medium 39 may be coated on the LED 34 using many different methods, with suitable methods being described in U.S. patent application Ser. Nos. 11/656,759 and 11/899,790. Alternatively the recipient luminophoric medium 39 may be coated on the LED 34 using other methods such an electrophoretic deposition (EPD), with a suitable EPD method described in U.S. patent application Ser. No. 11/473,089. Additional suitable methods of applying the recipient luminophoric medium 39 onto the LED 34 and/or the submount 32 are described below.

An optical element or lens 70 (see FIGS. 8C-8D) is formed on the top surface 40 of the submount 32, over the LED 34, to provide environmental and/or mechanical protection. The lens 70 can be molded using different molding techniques such as those described in U.S. patent application Ser. No. 11/982,275. The lens 70 can be many different shapes such as, for example, hemispheric, and can be formed of various materials such as silicones, plastics, epoxies or glass. The lens 70 can be textured to improve light extraction. In some embodiments, the recipient luminophoric medium 39 may be incorporated into the lens 70.

The surface area of the LED chip 34 may cover more than 10% or even 15% of the surface area of the submount 32. In some embodiments, the ratio of the width W of the LED chip 34 to the diameter D of the lens 70 may be greater than 0.5.

The top surface 40 of the submount 32 may include a die attach pad 42 with an integral first contact pad 44. A second contact pad 46 may also be included on the top surface 40 of the submount 32 with the LED 34 mounted approximately at the center of the die attach pad 42. The die attach pad 42 and first and second contact pads 44, 46 may comprise metals or other conductive materials such as, for example, copper. Seed layers and/or adhesion layers may be provided beneath the pads 42, 44, 46. The pads 42, 44, 46 may be patterned using standard lithographic processes. These pads 42, 44, 46 provide conductive paths for electrical connection to the LED 34 using known contacting methods.

A gap 48 (see FIG. 8A) is included between the second contact pad 46 and the die attach pad 42 down to the surface of the submount 32. An electrical signal is applied to the LED 34 through the first and second pads 44, 46, with the electrical signal on the first pad 44 passing directly to the LED 34 through the die attach pad 42 and the signal from the second pad 46 passing into the LED 34 through wire bonds. The gap 48 provides electrical isolation between the second pad 46 and the die attach pad 42 to prevent shorting of the signal applied to the LED 34.

Referring to FIGS. 8C and 8D, an electrical signal can be applied to the package 30 by providing external electrical contact to the first and second contact pads 44, 46 via first and second surface mount pads 50, 52 that are formed on the back surface 54 of the submount 32. Conductive vias 56 are formed through the submount 32 between the first mounting pad 50 and the first contact pad 44, and between the second mounting pad 52 and second contact pad 46 to provide electrical connections therebetween. In other embodiments, the pads 44, 46 may extend around the sides of the submount 32. The first and second mounting pads 50, 52 allow for surface mounting of the LED package 30, and the electrical signal may be applied to the LED 34 via the first and second mounting pads 50, 52.

The pads 42, 44, 46 also provide thermally conductive paths to conduct heat away from the LED 34.

A metalized area 66 is also provided on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Heat passes into the submount 32 directly below and around the LED 34. This heat may spread into the metalized area 66, where it can dissipate more readily. The heat can also conduct from the top surface 40 of the submount 32, through the vias 56, where the heat can spread into the first and second mounting pads 50, 52 where it can also dissipate. The heat spreading from the LED 34 may be improved, which may improve the operating life of the LED and/or allow for higher operating power.

FIGS. 9A-9D illustrate a packaged light emitting device 100 that includes multiple LEDs according to embodiments of the present invention. FIGS. 9A-9D are, respectively, a perspective view, a plan view, a side view and a bottom view of the device 100.

Figure 9A:
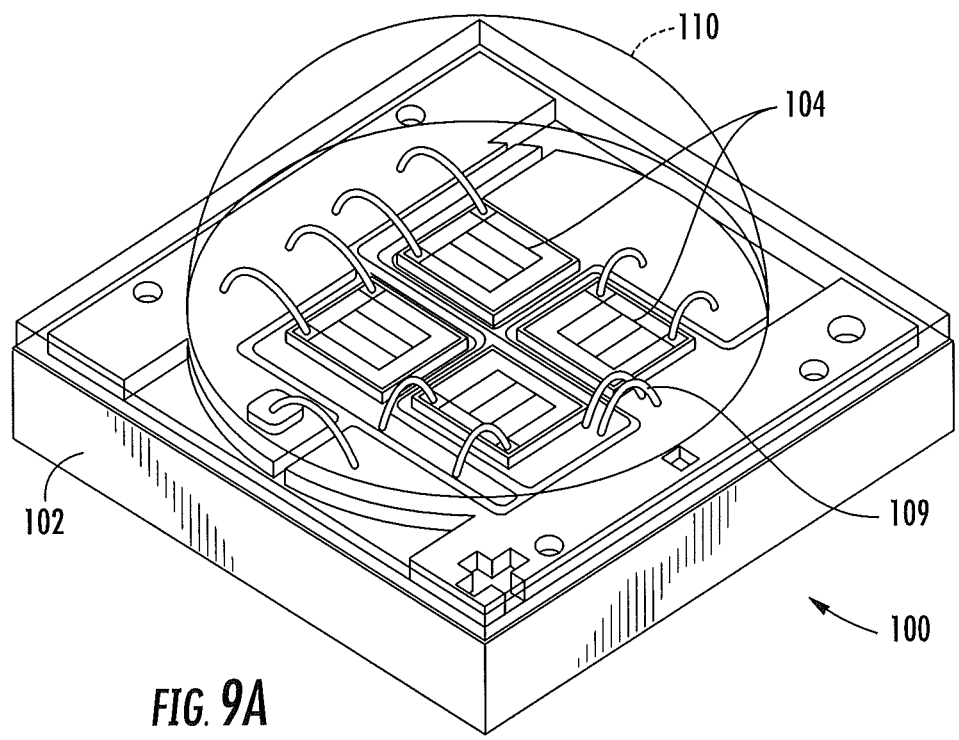
FIGS. 9A-9D are various views of a packaged light emitting device that includes multiple LED chips according to embodiments of the present invention.

As shown in FIG. 9A, the packaged light emitting device 100 includes four LED die 104, which are mounted on a common submount 102. The submount 102 and the LEDs 104 can be, for example, any of the submounts and LEDs that are discussed above with respect to FIGS. 8A-8D. In some embodiments, the LEDs 104 may, for example, each be an ultraviolet, violet or blue LED. In other embodiments, at least one the LEDs 104 may be an ultraviolet, violet or blue LED, while at least one other of the LEDs 104 may be an LED that emits radiation with a peak wavelength above 550 nm. For example, the LEDs 104 may include one or more LEDs that emit radiation with a peak wavelength in the blue color range and at least one or more LEDs 104 that emit radiation with a peak wavelength in the red color range.

In some embodiments, each of the LEDs 104 (and the submount 102, if desired) may be coated with a recipient luminophoric medium (not shown), which may be any of the recipient luminophoric mediums discussed in the present disclosure. As discussed above, this recipient luminophoric medium may include multiple luminescent materials that absorb at least some of the light emitted by the LEDs 104 and emit light at different wavelengths. The recipient luminophoric medium may be applied to the LEDs 104 in any suitable manner including, each of the techniques for applying a recipient luminophoric medium discussed in the present disclosure. The recipient luminophoric medium may alternatively be deposited onto and/or built into a lens 110 of the packaged light emitting device 100, or may be provided between the lens 110 and the LEDs 104.

Each LED 104 in the packaged light emitting device 100 may include a conductive current spreading structure 106 on its top surface such as the current spreading structures 36 discussed above with respect to light emitting device 30, as well as one or more contacts 108 that are accessible at its top surface for wire bonding. An optical element or lens 110 is formed on a the top surface of the submount 102 over the LEDs 104 to provide environmental and/or mechanical protection. The lens 110 may be any of the lenses 70 discussed above with respect to the light emitting device 30.

Figure 9B:
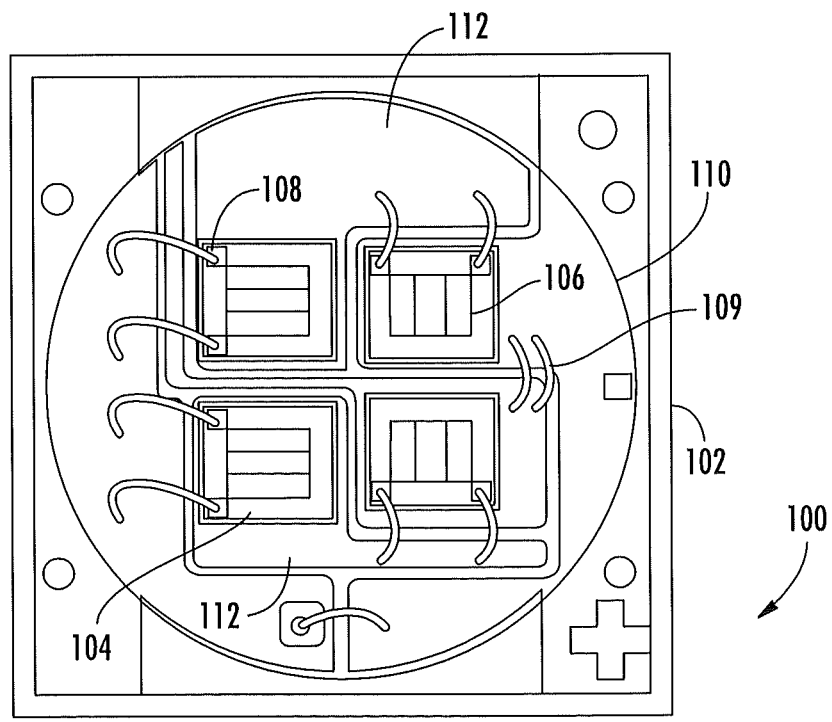
Figure 9C:
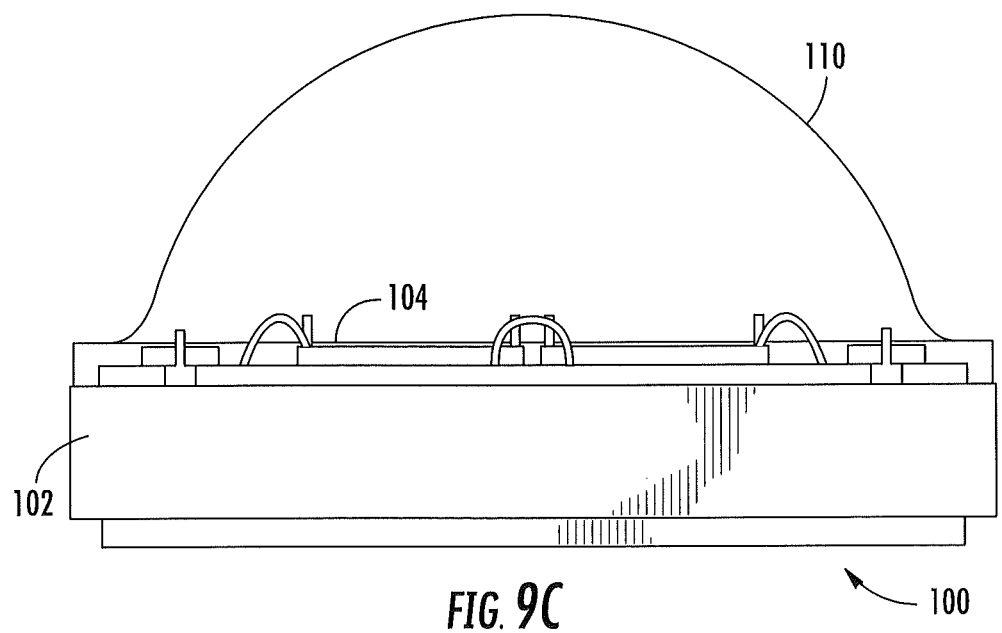
Figure 9D:
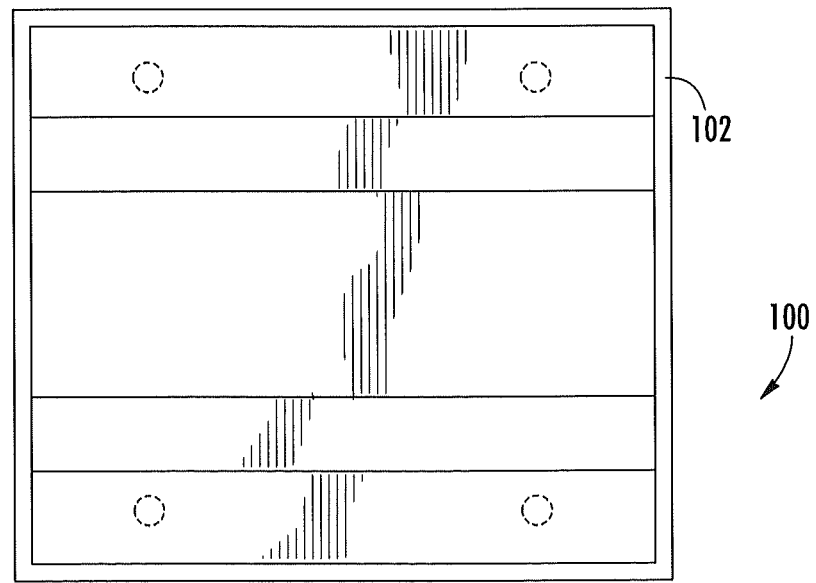
Figure 10A:
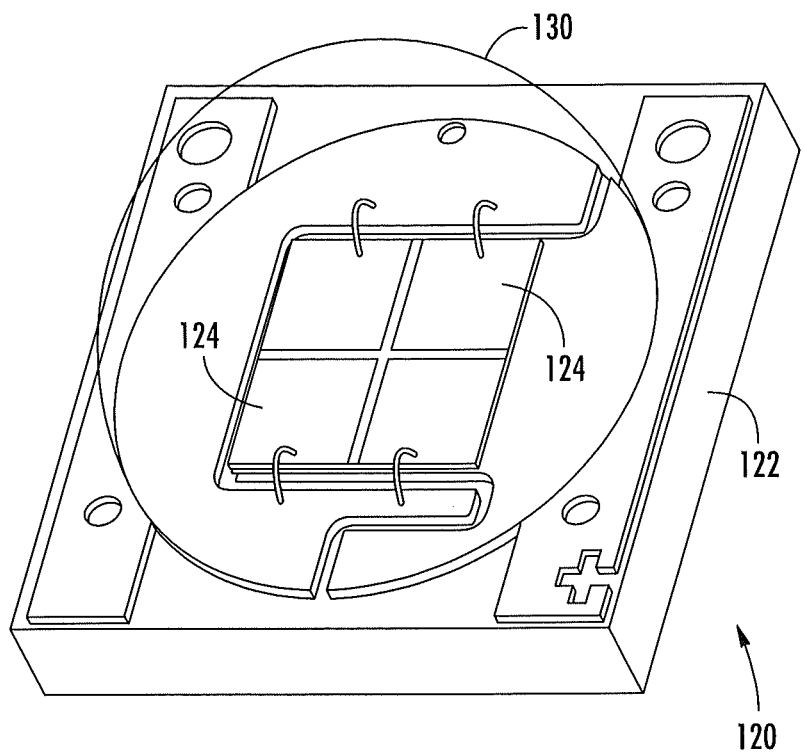
FIGS. 10A-10D are various views of another packaged light emitting device that includes multiple LED chips according to embodiments of the present invention.
Figure 10B:
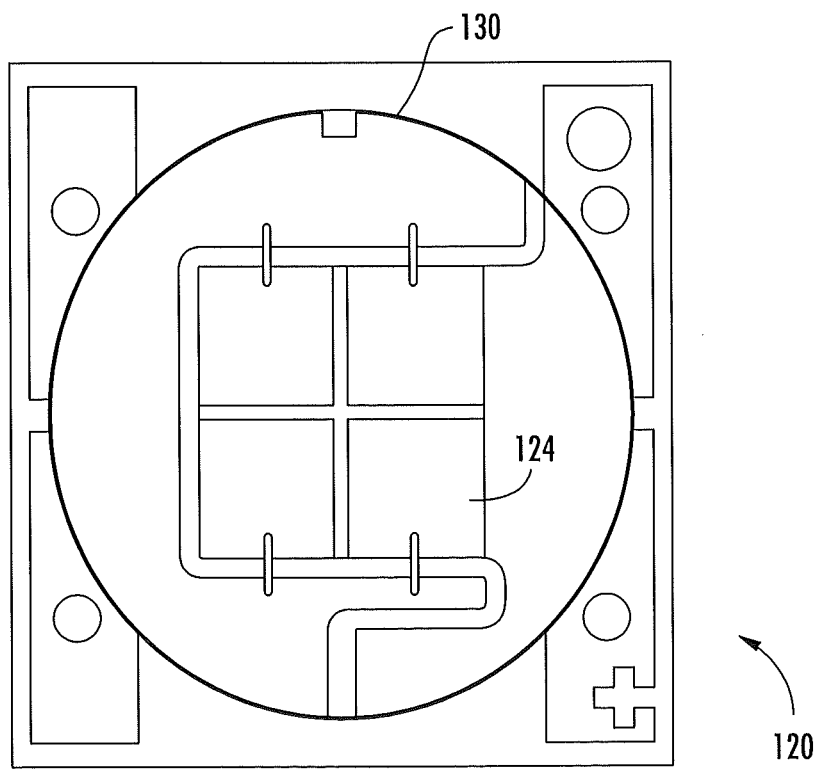
Figure 10C:
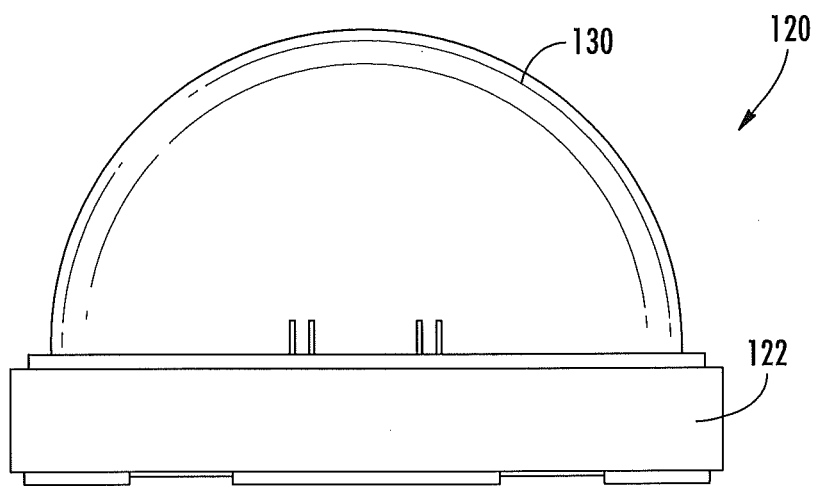
Figure 10D:
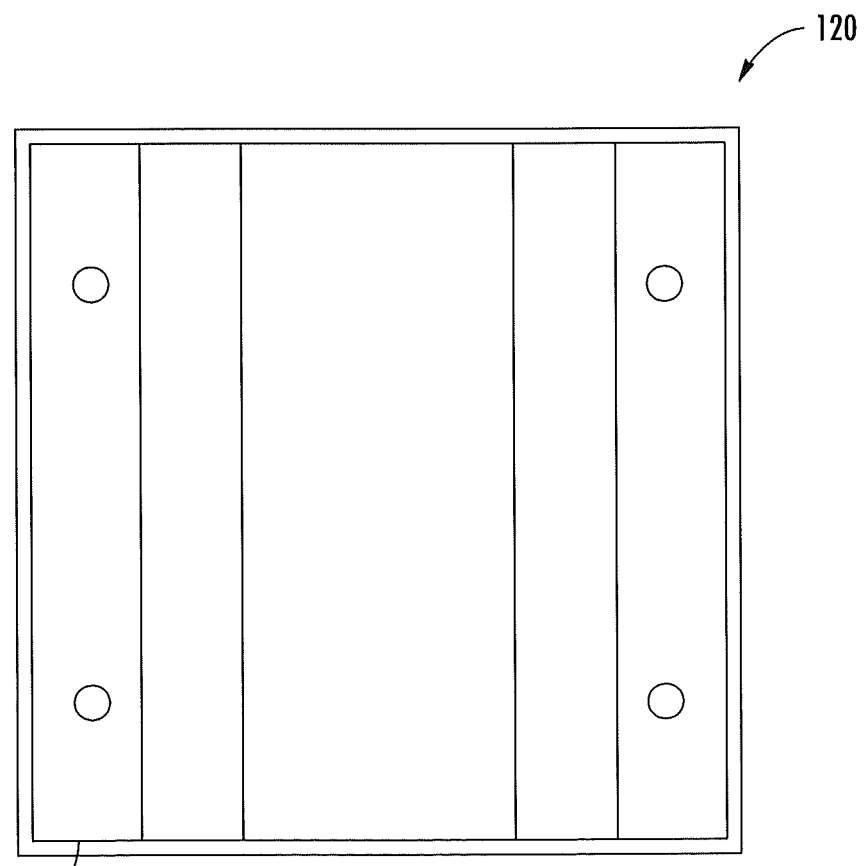

While FIGS. 9A-9C illustrate two wire bonds being attached to the top side of each LED 104, it will be appreciated that more or less wire bonds may be used. The two wire bonds are attached to each LED 104, which may comprise two contacts to an n-type layer of the LED, two contacts to a p-type layer of the LED, or one contact to an n-type layer and one contact to a p-type layer of the LED. Additional contacts may be provided on the bottom side of each LED 104. For example, if the two wire bonds that are connected to a particular one of the LEDs 104 attach to contact pads on an n-type layer of the LED, then one or more additional contacts (e.g., contact pads) may be provided on the bottom side of LED to provide an external contact to the p-side layers of the LED. It will also be appreciated that additional wire bonds or other contacting structures may be provided that may be used to electrically connect the LEDs 104 in series, in parallel, or in a combination thereof. Two such wirebonds 109 are shown in FIGS. 9A-9B.

The top surface of the submount 102 may have patterned conductive features that can include die attach pads 112 which the LEDs 104 may be mounted on. Electrical contact may be made to each of the LEDs 104 using known wire bonding and contact methods such as, for example, those discussed above with respect to the light emitting device 30 of FIGS. 8A-8B and/or though electrical connections to the die attach pads 112 The die attach pads 112 may have reflective upper surfaces. The recipient luminophoric mediums according to embodiments of the present invention may be coated onto or otherwise deposited on these patterned conductive features in some embodiments, and may thereby act to further down-convert light emitted by the LEDs 104 that impinges on these reflective surfaces.

The bottom side of the packaged light emitting device 100 (FIG. 9D) may be substantially identical to the bottom side of the packaged light emitting device 30 (albeit, likely larger). An electrical signal can be applied to the packaged light emitting device 100 by providing external electrical contact to first and second surface mount pads (not shown) that are formed on the back surface of the submount 102. This electrical signal may be applied to each of the LEDs 104 in the same manner, described above, that an electrical signal is provided to the LED 34 of FIGS. 8A-8D.

FIGS. 10A-10D illustrate another packaged light emitting device 120 that includes multiple LEDs according to embodiments of the present invention. FIGS. 10A-10D are, respectively, a perspective view, a plan view, a side view and a bottom view of the device 120.

The packaged light emitting device 120 is very similar to the packaged light emitting device 100 of FIGS. 9A-9D, with the primary difference being that the device 100 uses LEDs 104 that have two top-side contacts and hence have two top-side wire bonds 109 between each LED chip 104 and the submount 102, while the device 120 uses LEDs 124 that have a single top-side contact and hence have a single top-side wire bond between each LED chip 124 and the submount 122. Each of the LEDs 124 may operate in conjunction with a recipient luminophoric medium (not shown), which may be any of the recipient luminophoric mediums described in the present disclosure. The recipient luminophoric medium may be deposited, for example, on a top surface of the LEDs 124, deposited on and/or included within a lens 130 of the packaged light emitting device 120, and/or provided between the lens 130 and the LEDs 124.

Figure 11A:
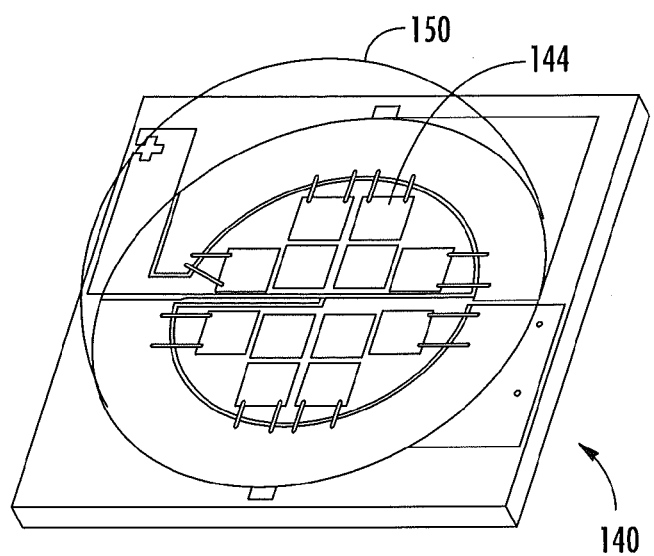
FIGS. 11A-11C are various views of yet another packaged light emitting device that includes multiple LED chips according to embodiments of the present invention.
Figure 11B:
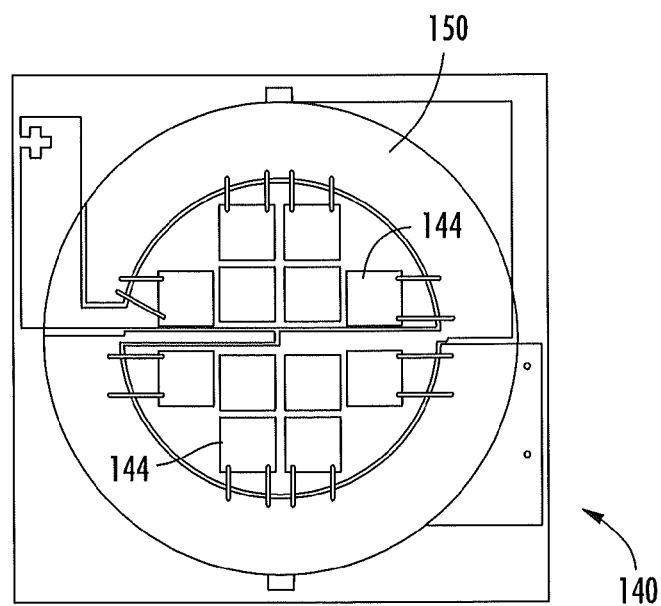
Figure 11C:
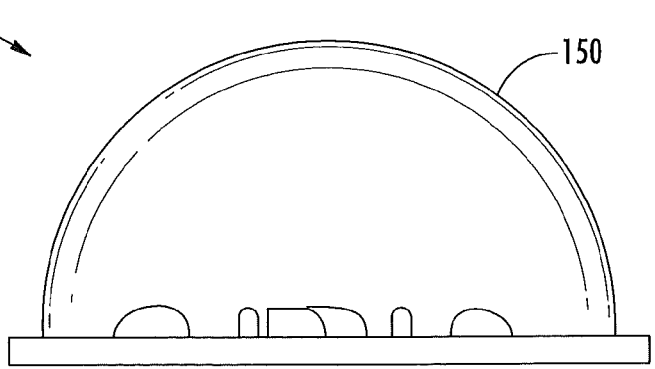

FIGS. 11A-11C illustrate another packaged light emitting device 140 according to embodiments of the present invention that includes multiple LEDs. FIGS. 11A-11C are, respectively, a perspective view, a plan view and a side view of the device 140.

The device 140 of FIGS. 11A-11C is similar to the device 100 of FIGS. 9A-9D, with the primary difference being that the packaged light emitting device 140 includes a total of twelve LEDs 144 as opposed to four LEDs. The packaged light emitting device 140 may include any of the recipient luminophoric mediums disclosed herein (not shown). The recipient luminophoric medium may be deposited on a top surface of the LEDs 144, deposited on and/or included within a lens 150 of the packaged light emitting device 140, and/or provided between the lens 150 and the LEDs 144 using, for example, any of the methods of depositing a recipient luminophoric medium discussed herein.

While FIGS. 8A-11C illustrate several exemplary packaged light emitting devices that may include recipient luminophoric mediums according to embodiments of the present invention, the recipient luminophoric mediums disclosed herein may be included in other packaged light emitting devices including, for example, the packaged LEDs that are disclosed in U.S. Provisional Patent Application No. 61/173,550, filed Apr. 28, 2009.

In some embodiments, the recipient luminophoric mediums may be directly coated onto a surface of a semiconductor wafer before the wafer is singulated into, for example, individual LED chips. One such process for applying the recipient luminophoric medium will now be discussed with respect to FIGS. 12A-12E. In this embodiment, each LED chip 210 is a vertically-structured device that is formed on a substrate 220 and that has a top contact 224 and a bottom contact 222.

Figure 12A:
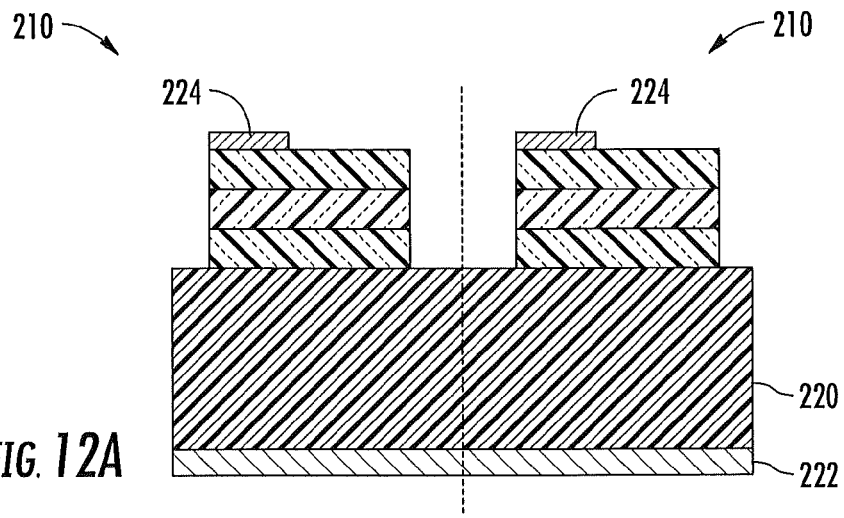
FIGS. 12A-12E are sectional views illustrating fabrication steps that may be used to apply a recipient luminophoric medium to an LED wafer according to certain embodiments of the present invention.

Referring to FIG. 12A, two LED chips 210 are shown at a wafer level of their fabrication process. In this particular embodiment, the top contact 224 is a p-type contact and the bottom contact 222 is an n-type contact. In other embodiments, the contacts 222, 224 may be arranged differently.

Figure 12B:
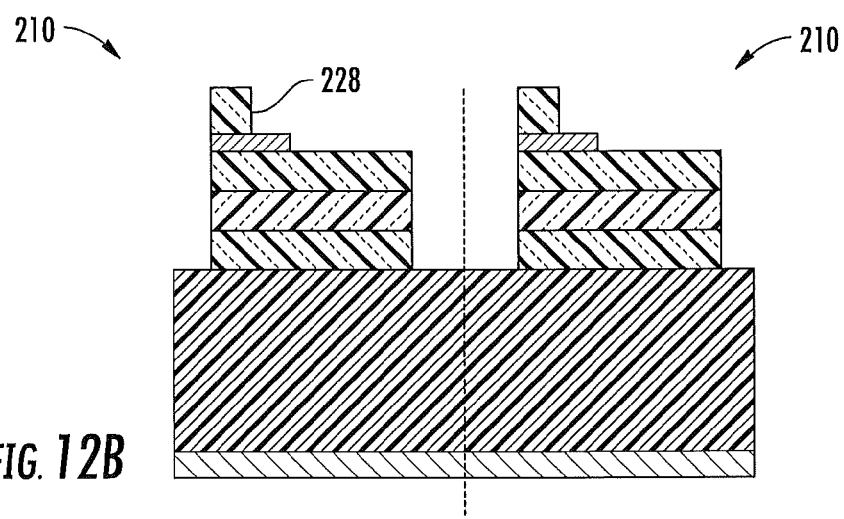

As shown in FIG. 12B, a conductive contact pedestal 228 is formed on the top contact 224 that is utilized to make electrical contact to the p-type contact 224 after the LED chips 210 are coated with a recipient luminophoric medium. The pedestal 228 can be formed of many different electrically conductive materials and can be formed using many different known physical or chemical deposition processes such as electroplating, mask deposition (e-beam, sputtering), electroless plating, or stud bumping. The pedestal 228 should extend to or above the top surface of a recipient luminophoric medium that is deposited in a later step.

Figure 12C:
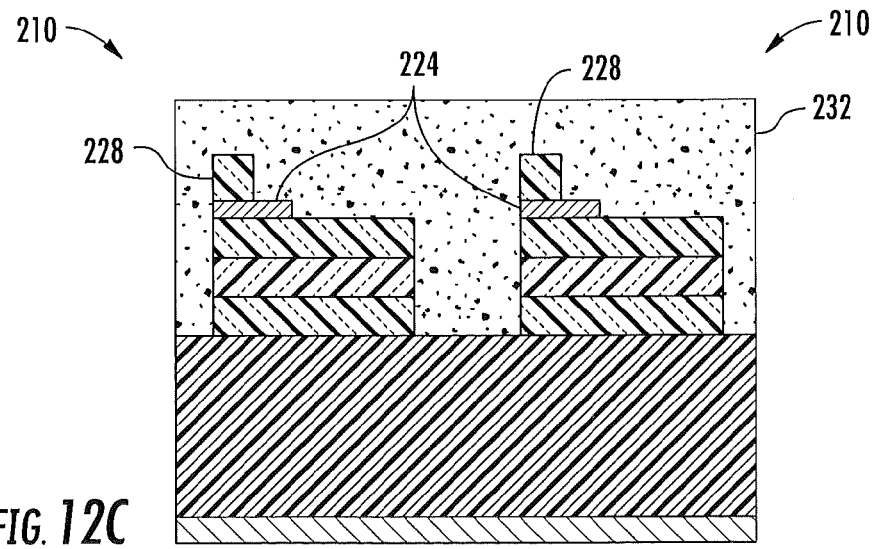

As shown in FIG. 12C, the wafer is blanketed by a recipient luminophoric medium coating 232 that covers the LED chips 210, the contacts 222, and the pedestals 228. The coating 232 may comprise a binder and of luminescent materials. The luminescent materials may comprise, for example, the luminescent material combinations discussed above according to embodiments of the present invention. The binder may be a material that is robust after curing and substantially transparent in the visible wavelength spectrum such as, for example, a silicone, epoxy, glass, inorganic glass, spin-on glass, dielectrics, BCB, polymides, polymers and the like. The recipient luminophoric medium coating 232 can be applied using different processes such as spin coating, dispensing, electrophoretic deposition, electrostatic deposition, printing, jet printing or screen printing. Another suitable coating technique is disclosed in U.S. patent application Ser. No. 12/717,048, filed Mar. 3, 2010, the contents of which are incorporated herein by reference. The recipient luminophoric medium coating 232 can be cured using any appropriate curing method (e.g., heat, ultraviolet (UV), infrared (IR) or air curing).

The coating 232 can also have different concentrations or loading of luminescent materials in the binder, with a typical concentration being in range of 30-70% by weight. The coating 232 can comprise multiple layers of different concentrations or types of luminescent materials, and the multiple layers can include different binder materials. One or more of the layers can be provided without luminescent materials. For example, a first coat of clear silicone can be deposited followed by phosphor loaded layers. As another example, the coating may comprise, for example, a three layer coating that includes a first layer having a first luminescent material with a peak wavelength in the green color range that is coated directly on the LED chips 210, a second layer having a second luminescent material with a peak wavelength in the yellow color range that is coated directly on the first layer, and a third layer having a third luminescent material with a peak wavelength in the red color range that is coated directly on the second phosphor. Numerous other layer structures are possible, including multi-layers that include multiple luminescent materials in the same layer. Intervening layers or elements could also be provided between layers and/or between the coating and the underlying LED chips 210.

Figure 12D:
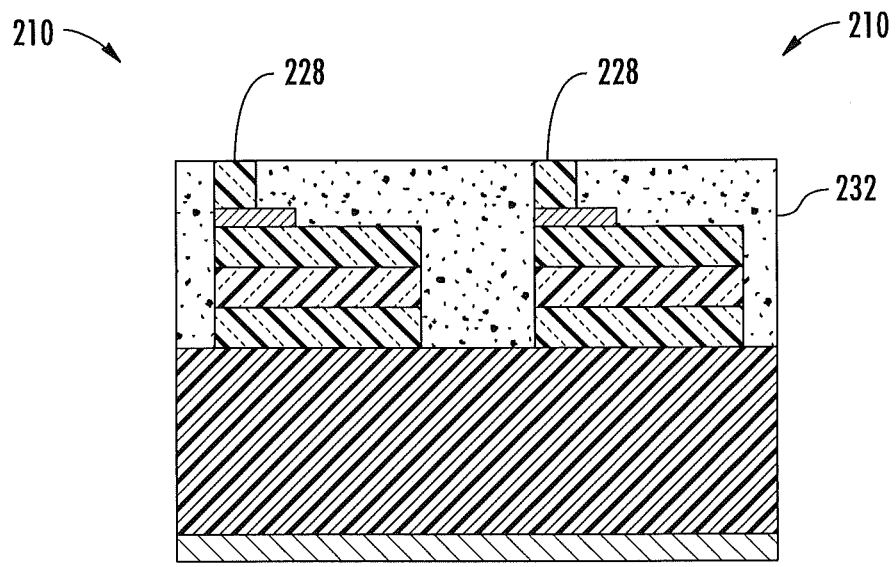

As shown in FIG. 12D, after the recipient luminophoric medium coating 232 is coated onto the LED chips 210, the coating 232 is thinned or planarized to expose the pedestals 228. Based on the operating characteristics of the LEDs 210 and the properties of the luminescent materials used, the end thickness of the coating 232 can be calculated to reach a desired color point/range and still expose the pedestals 228. The thickness of the coating 232 can be uniform or non-uniform across the wafer.

Figure 12E:
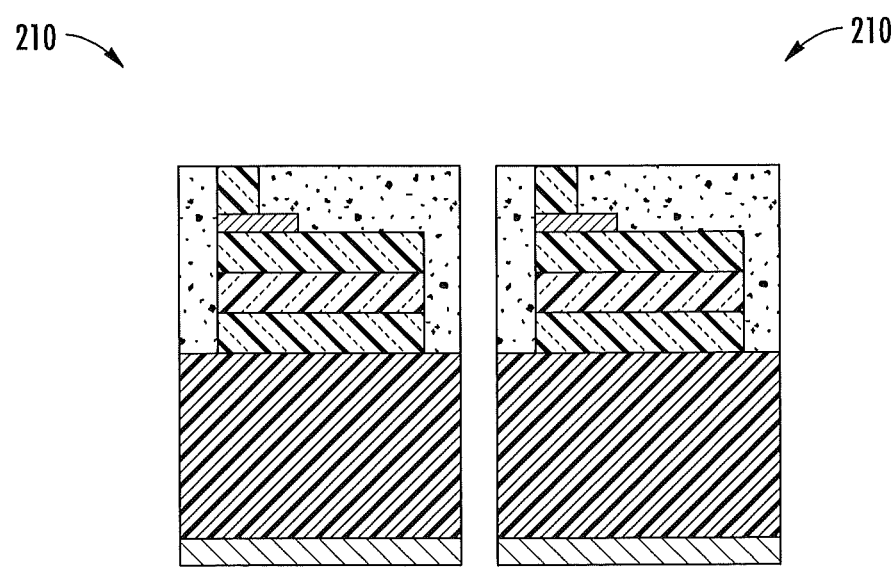

As shown in FIG. 12E, the individual LED chips 210 can thereafter be singulated from the wafer using known methods. Following singulation of the LED chips 210, a layer of coating 232 remains on the side surfaces of the LEDs 210 and light emitting from the side surfaces of the LEDs 210 also passes through the coating 232 and its luminescent materials. This results in conversion of at least some of the side emitting light, which can provide LED chips 210 having more consistent light emitting characteristics at different viewing angles.

The recipient luminophoric mediums according to embodiments of the present invention may also be applied to a light emitting device while the light emitting device is exposed to a curing agent. The curing agent may be, for example, heat, radiation, a material that is present on or in the light emitting device, or other agents that speed up the curing of the recipient luminophoric medium.

Figure 13:
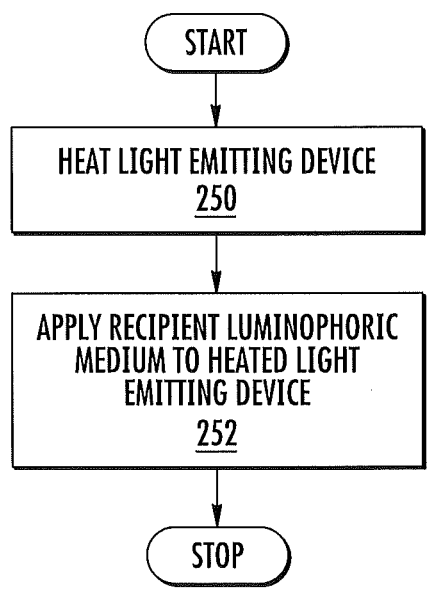
FIG. 13 is a flowchart illustrating operations for applying a recipient luminophoric medium to an LED wafer according to further embodiments of the present invention.

Reference is now made to FIG. 13, which is a flow diagram illustrating operations for applying a recipient luminophoric medium onto a light emitting device where heat is applied as a curing agent during the application of the recipient luminophoric medium. The light emitting device may comprise, for example, a singulated LED chip (which may have one or more bonding wires connected thereto) or an LED wafer prior to singulation. As shown in the flow chart of FIG. 13, the light emitting device is heated by one or more heating devices (block 250). The heating device(s) may include, for example, electrically resistive heating components, inductive heating components and/or combustion-related heating components. In some embodiments, the light emitting device may be heated and then subsequently processed after the heating operation(s), while in other embodiments, heat may be provided throughout the subsequently described operations. In some embodiments, the light emitting device may be heated by turning on the light emitting device and driving it at a sufficiently high current to generate the necessary heat. However, in many cases it would be necessary to drive the light emitting device at currents that exceed the current rating for the device, so external heat sources may be desired in most situations. In some embodiments, the light emitting device may be heated to a temperature in a range of about 90 degrees Celsius to about 155 degrees Celsius.

A recipient luminophoric medium is applied to the heated light emitting device (block 252). In some embodiments, the recipient luminophoric medium may be applied in the form of a luminescent solution. The luminescent solution may include binder material(s), volatile and/or nonvolatile liquid solvents and luminescent materials. The luminescent solution may be atomized using a flow of pressurized gas such as pressurized air. While typically the luminescent solution will comprise a liquid mixture, the term "solution" is used broadly herein to cover any mixture of substances, whether or not such mix is homogeneous and regardless of the form of the substances. The atomized luminescent solution may be sprayed or otherwise deposited onto the heated light emitting device using the flow of pressurized gas.

In some embodiments, multiple layers may be applied to the light emitting device to form the recipient luminophoric medium. These layers may or may not be the same, and may or may not use the same luminescent materials. Since each layer may rapidly cure once it is deposited on the heated light emitting device, subsequent layers may be applied directly thereafter, if desired.

FIGS. 14A-14L illustrate operations for forming a recipient luminophoric medium on a light emitting device according to further embodiments of the present invention. In the embodiments discussed with respect to FIGS. 14A and 14C-14L, a luminescent solution 354 is applied to a singulated light emitting device 370 (here an LED chip) that is mounted on a substrate 360. The luminescent solution 354 may also and/or alternatively be applied to a lens 394 and/or a reflector cup 362 of the LED chip 370; as will be discussed later herein. The luminescent solution 354 may be applied in a similar manner to, for example, bare (i.e. unmounted) LED die and/or to LED wafers (see FIG. 14B).

Figure 14A:
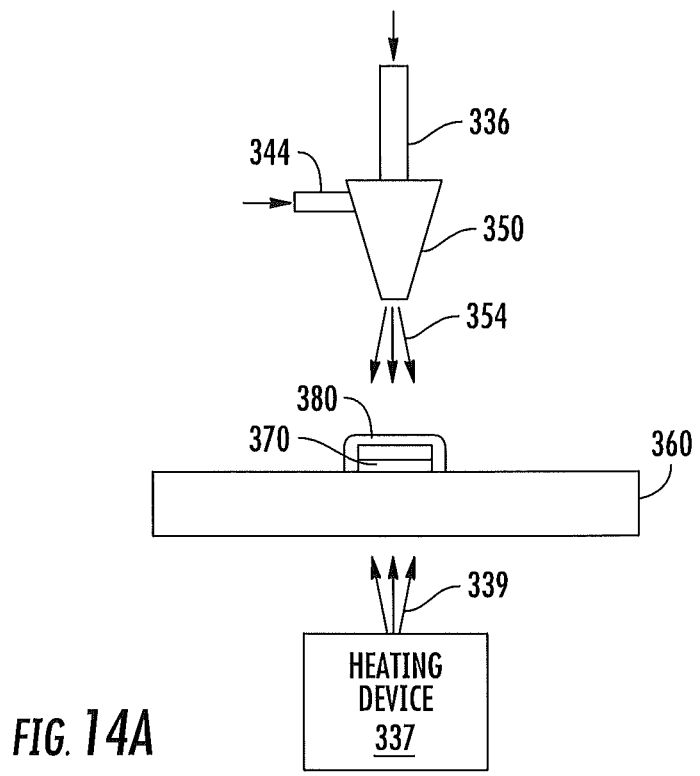
FIGS. 14A-14L are a series of schematic diagrams that illustrate the application of a recipient luminophoric medium to a semiconductor light emitting device according to some embodiments of the present invention.

As shown in FIG. 14A, a heating device 337 may provide heat to the LED chip 370. Some embodiments provide that a nozzle 350 is configured to spray the luminescent solution 354 onto the heated LED chip 370 to provide a recipient luminophoric medium 380 thereon. The recipient luminophoric medium 380 may be a conformal layer.

Figure 14B:
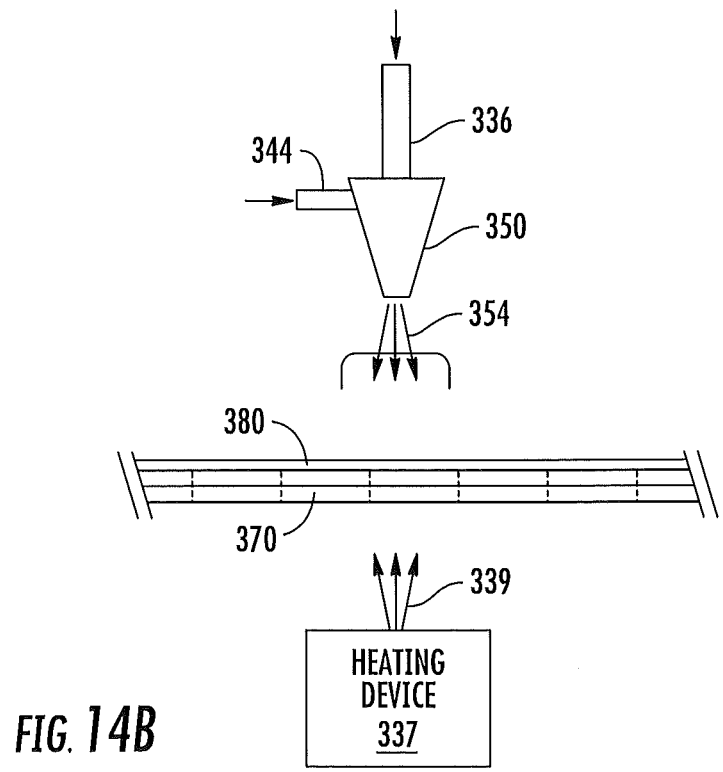

As shown in FIG. 14B, the light emitting device 370 may alternatively comprise a wafer 370' which is heated by the heating device 337, and the luminescent solution 354 may be applied to an exposed surface of the wafer 370' to form a conformal recipient luminophoric medium 380 thereon. The wafer 370 may be singulated after the luminescent solution 354 is applied to provide individual LED chips.

Figure 14C:
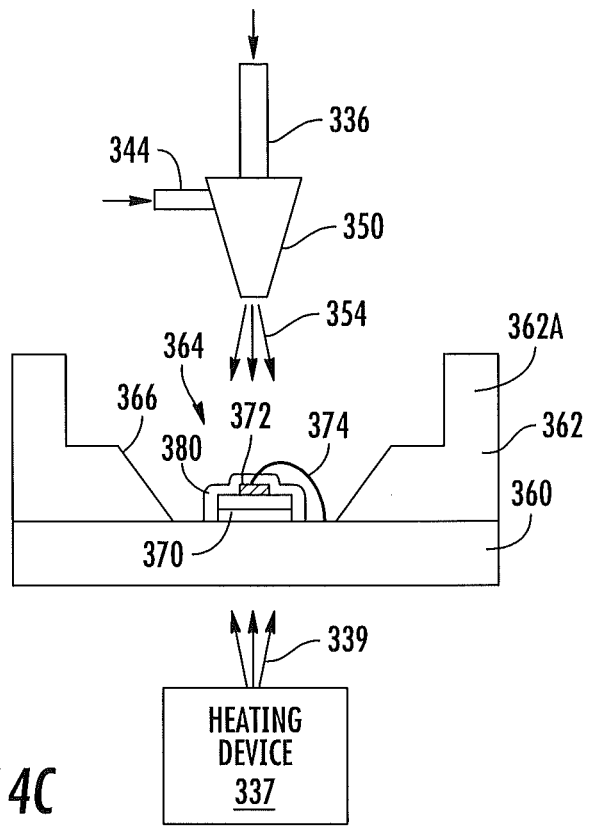

As shown in FIG. 14C, the LED chip 370 may be mounted on a substrate 360. The LED chip 370 can be mounted on the substrate 360 through an intermediary structure, such as a bonding pad and/or submount (not shown). In some embodiments, the LED chip 370 can be mounted in an optical cavity 364 defined by a reflector cup 362 that is placed on the substrate 360 (or which alternatively may be part of the substrate 360). The reflector cup 362 includes an angled reflective surface 366 facing the LED chip 370 that is configured to reflect light emitted by the LED chip 370 away from the optical cavity 364. The reflector cup 362 further includes upwardly extending sidewalls 362A that define a channel for receiving and holding a lens 94 (see FIG. 14D). In other embodiments, the LED chip 370 could be mounted on a substrate 360, printed circuit board or other support member without any reflector around the LED chip 370. In still other embodiments, the substrate 360 could be a leadframe, and a package body may be formed on the leadframe surrounding the LED chip 370 to define an optical cavity. As further examples, the LED chip 370 could be mounted in any of the exemplary packages discussed above with reference to FIGS. 8A-11C.

Still referring to FIG. 14C, the LED chip 370 can include a wirebond pad 372, and a wirebond connection 374 can be formed from the wirebond pad 372 to a contact pad (not shown) on the substrate 360 or elsewhere. However, it will be appreciated that the LED chip 370 could be a horizontal LED chip having both anode and cathode contacts on the same side of the chip, and could be mounted in flip-chip fashion on the substrate 360, so that no bond wire connections need be made to the LED chip 370 in some embodiments.

The luminescent solution 354 may be supplied via a liquid supply line 336 to a spray nozzle 350. The heating device 337 may apply heat 339 to increase the temperature of the LED chip 370, the substrate 360, the reflector cup 362 and the wirebond pad 372. The luminescent solution 354 in the supply line 336 is sprayed onto the LED chip 370, forming a thin layer that, when cured, forms the recipient luminophoric medium 380. The thermal energy from the heated LED chip 370 and substrate 360 may cause the luminescent solution 354 to cure rapidly. By rapidly curing the luminescent solution 354, a substantially uniform and conformal recipient luminophoric medium 380 may be provided on the LED chip 370 and the substrate 360.

When volatile solvent liquids are used, the volatile liquid may be evaporated by the thermal energy of the heated substrate 360 and LED chip 370, leaving the luminescent materials (and perhaps other elements such as diffuser particles that may be in the luminescent solution 354) in the binder material to provide the conformal recipient luminophoric medium 380. In other embodiments, a non-volatile liquid, such as silicone and/or epoxy resin, may be used as a carrier liquid for the luminescent materials, in which case the non-volatile liquid may be cured by the thermal energy of the heated substrate 360 and LED chip 370 to form the conformal recipient luminophoric medium 380.

Figure 14D:
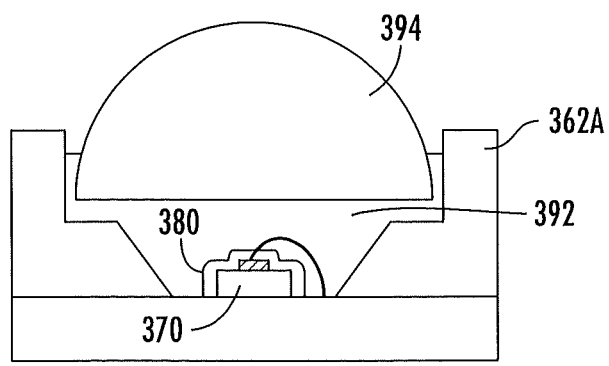

Referring to FIG. 14D, after the conformal recipient luminophoric medium 380 is formed, an encapsulant material 392, such as silicone and/or epoxy, can be dispensed to at least partially fill the optical cavity 364, and a lens 394, such as a glass or silicone lens, can be positioned over the LED chip 370.

Figure 14E:
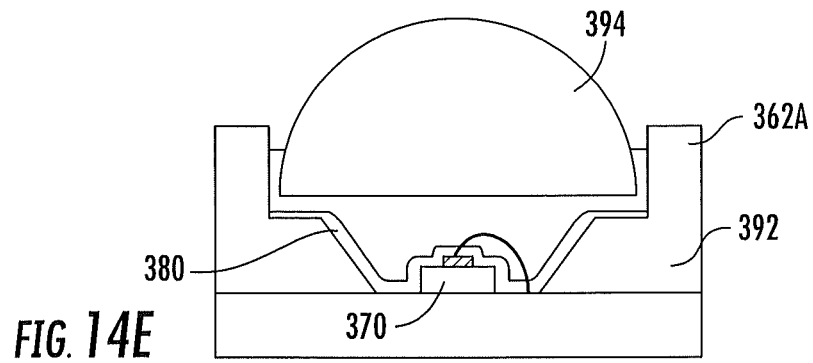
Figure 14F:
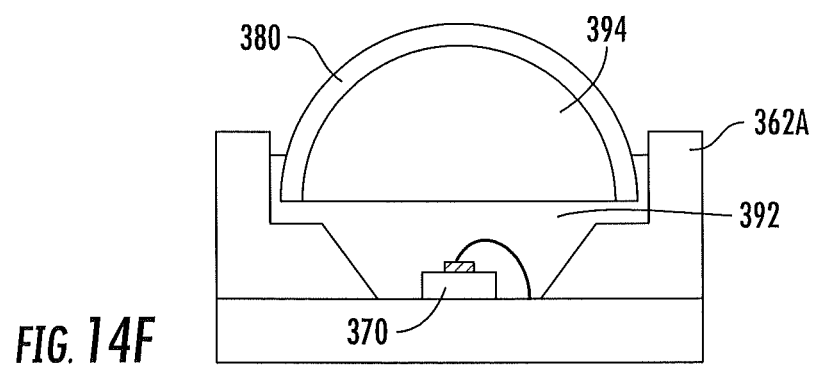
Figure 14G:
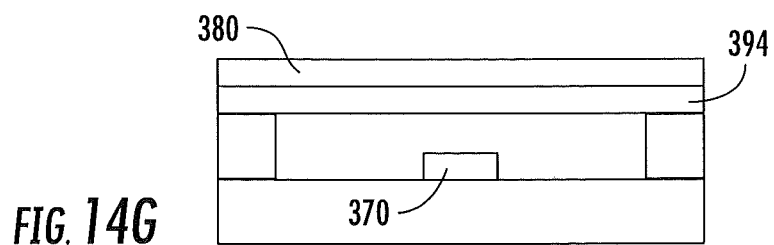
Figure 14H:
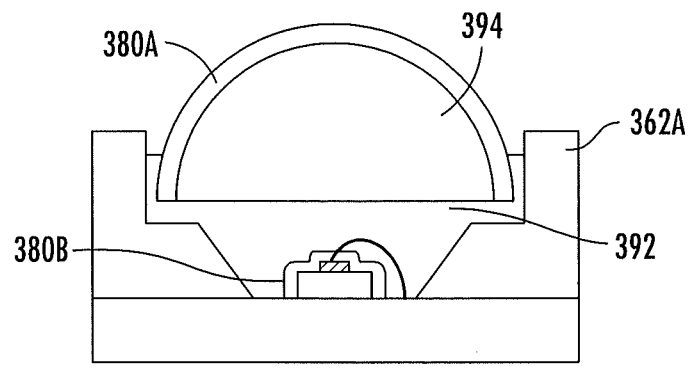

As shown in FIG. 14E, pursuant to further embodiments, the luminescent solution 354 in the supply line 336 may be sprayed onto both the LED chip 370 and the surrounding structure, such as, for example, the reflector cup 362 to form the recipient luminophoric medium 380 thereon. As shown in FIG. 14F, in still other embodiments, the recipient luminophoric medium 380 may be formed on an exterior and/or interior surface of the lens 394, which is heated to cause the recipient luminophoric medium 380 to cure. As shown in FIG. 14G, in still further embodiments, the recipient luminophoric medium 380 may be applied to a two-dimensional structure, such as, for example, a lens 394 or other transmissive and/or reflective optical element. In other embodiments, multiple of the above-described techniques may be used. By way of example, as shown in FIG. 14H, a first recipient luminophoric medium 380A may be applied to a heated lens 394 and a second recipient luminophoric medium 380B may be applied to the heated LED chip 370.

Figure 14I:
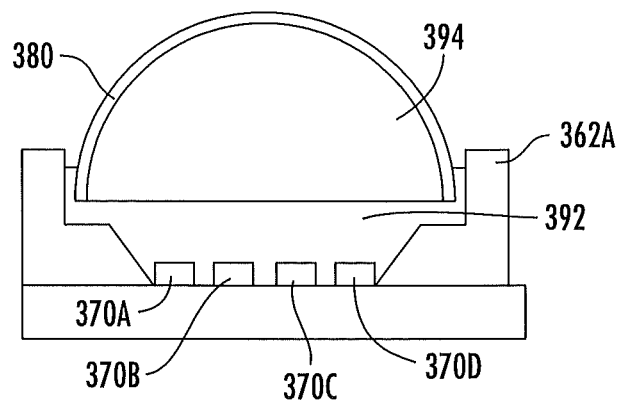
Figure 14J:
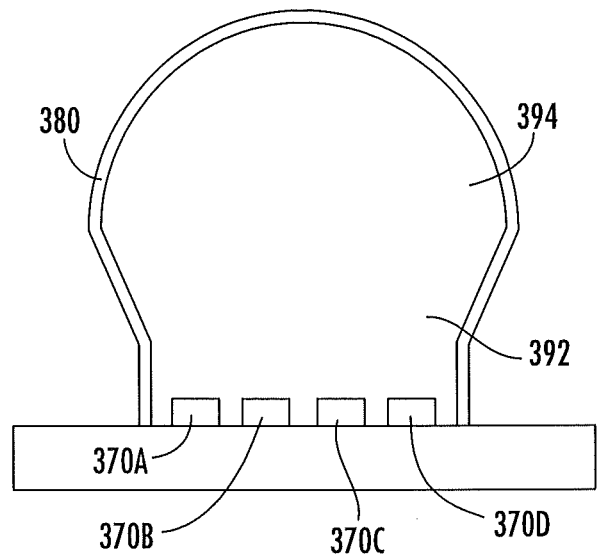
Figure 14K:
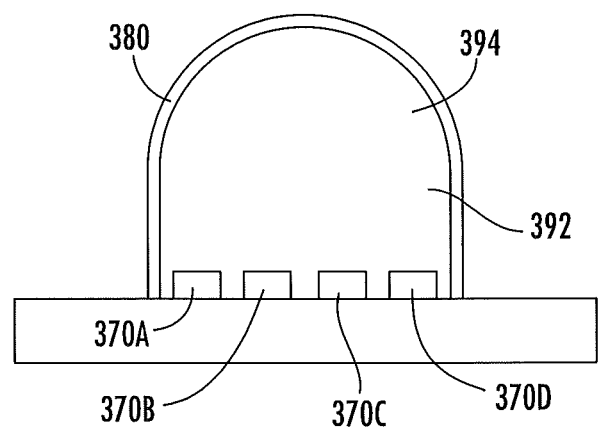
Figure 14L:
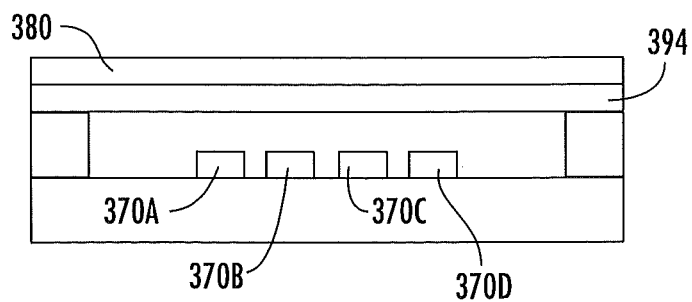

As shown in FIG. 14I, recipient luminophoric mediums according to embodiments of the present invention may be formed on a light emitting device that includes multiple LED chips 370A-D. The LED chips 370A-D may be configured to emit light at one or more different peak wavelengths and/or combinations thereof. In the embodiment depicted in FIG. 14I, the recipient luminophoric medium 380 is provided on the outside of a lens 394. FIGS. 14J, 14K and 14L illustrate additional exemplary embodiments in which multiple LED chips 370A-D are provided inside a lens 394 that includes a recipient luminophoric medium 380 thereon.

Figure 15:
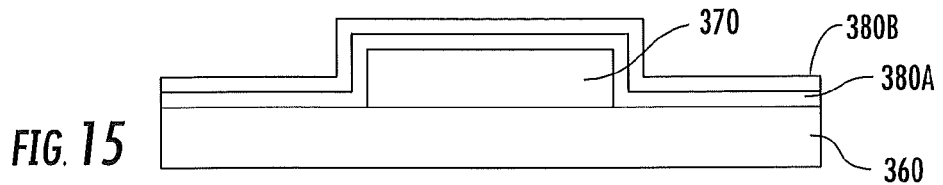
FIG. 15 is a schematic diagram of a multi-layer recipient luminophoric medium according to some embodiments of the present invention.

In FIGS. 14A-14L, the recipient luminophoric medium 380 may comprise any of the above-described recipient luminophoric mediums according to embodiments of the present invention that include, for example, both broad-spectrum and narrow-spectrum luminescent materials. As discussed above, the various luminescent materials included in the recipient luminophoric medium may all be mixed in a single layer or coating or may be provided in separate layers, where each layer includes one or more of the luminescent materials and perhaps other materials as well such as diffuser particles, binder materials, etc. By As one simple example, FIG. 15 illustrates an LED chip 370 on a submount 360 that has a multi-layer recipient luminophoric medium 380 thereon that comprises a first layer 380A and a second layer 380B. Additional and/or intervening layers may also be provided. The different layers 380A and 380B of the recipient luminophoric medium 380 can include the same or different materials. By way of example, the first layer 380A may include a first luminescent material, and the second layer 380B may include the first luminescent material, a different second luminescent material and/or other elements (e.g., diffuser particles).

Figure 16:
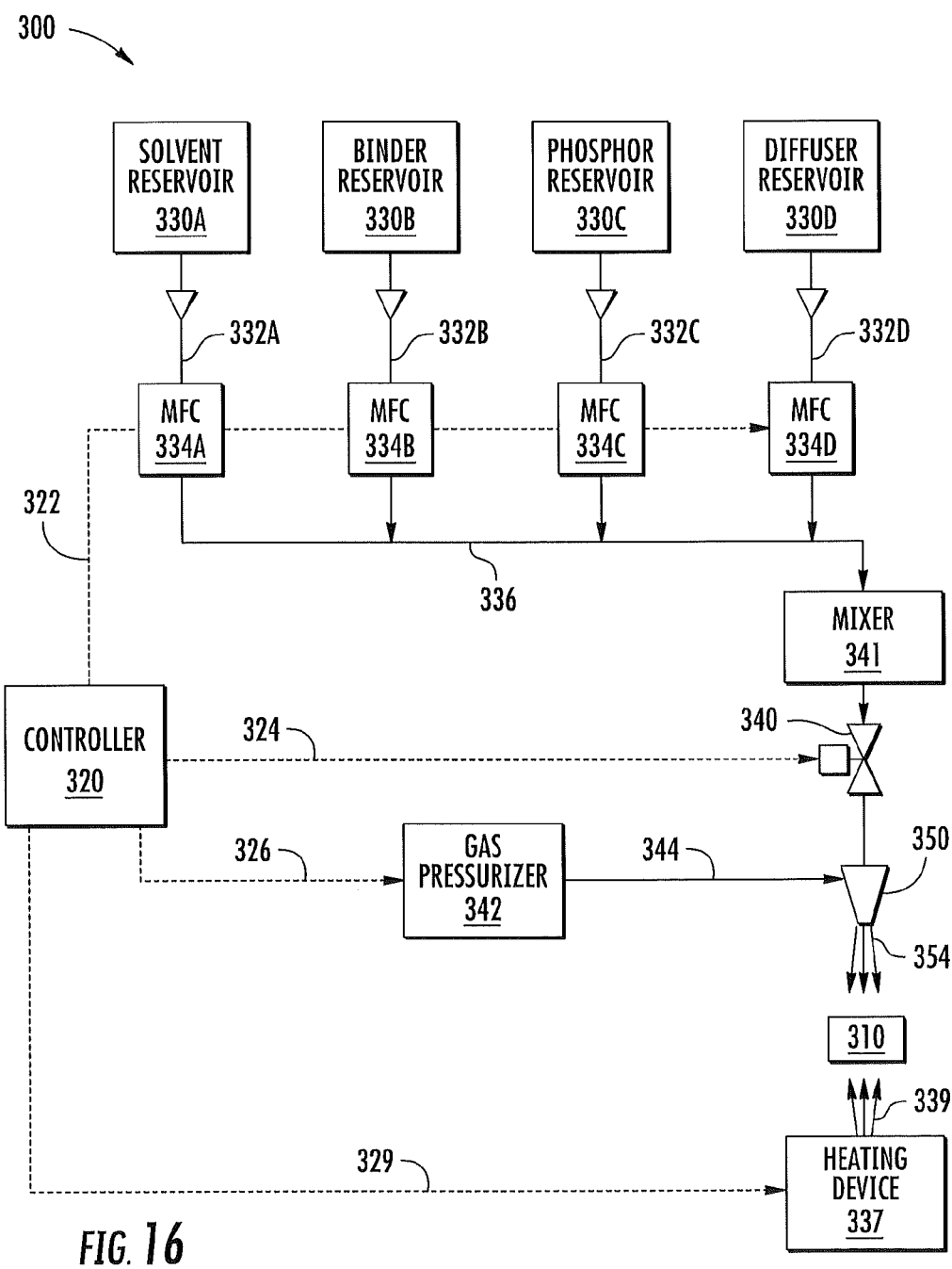
FIG. 16 is a schematic diagram illustrating a pressurized deposition system for depositing a recipient luminophoric medium according to some embodiments of the present invention.

FIG. 16 is a schematic diagram illustrating a pressurized deposition system 300 that may be used to spray coat, for example, an LED 310 with a luminescent solution 354 to form a recipient luminophoric medium 380 according to embodiments of the present invention thereon. A heating device 337 applies heat (thermal energy) 339 to the LED 310 to increase the temperature thereof. A supply line 336 supplies the luminescent solution 354 to a spray nozzle 350, which sprays the luminescent solution 354 onto the heated LED 310. Pressurized gas supplied to the spray nozzle 350 through a high pressure gas supply line 344 atomizes the luminescent solution 354 and directs it towards the LED 310. The term "atomize" is used herein in a general sense to refer to reducing a liquid to minute particles and/or to a fine spray. The atomized luminescent solution 354 that is deposited on the heated LED 310 may rapidly cure to form a conformal recipient luminophoric medium 380 thereon, which may reduce settling, separation and/or stratification of the luminescent materials in the recipient luminophoric medium 380.

In some embodiments, the liquid in the supply line 336 may include binder materials such as a liquid silicone and/or liquid epoxy, and a volatile or nonvolatile solvent such as alcohol, water, acetone, methanol, ethanol, ketone, isopropynol, hydrocarbon solvents, hexane, ethylene glycol, methyl ethyl ketone, xylene, toluene, and combinations thereof. In general, a volatile solvent may dry or evaporate off shortly after being deposited. The solvent material can include particles of a luminescent material therein and/or particles of a light-scattering material, such as titanium dioxide. The liquid in the supply line 336 may be provided from one of a plurality of fluid reservoirs 330A-D, which are attached to the supply line 336 through respective input lines 332A-D. The flow of liquid through the input lines 332A-D can be controlled by electronically-controlled mass flow controllers 334A-D, respectively. In some embodiments, the reservoirs 330A-D can include a solvent reservoir 330A that contains the liquid solvent, a binder reservoir 330B that contains a liquid binder material, a phosphor reservoir 330C that contains a liquid solvent in which phosphor particles (or other luminescent materials) are suspended, and a diffuser reservoir 330D that contains a liquid solvent in which a concentration of diffuser particles is suspended. One or more of the reservoirs 330A-D can be pressurized, so that flow from the reservoirs 330A-D can be obtained by positive pressure into the supply line 363.

The flow of liquid through the supply line 336 can be controlled by an electronically controllable valve 340. The mass flow controllers 334A-D, the electronically controllable flow valve 340, and the gas pressurizer 342 can be controlled by a controller 320 (e.g., an application specific integrated circuit) via electronic control lines 322, 324, 326. By controlling the operations of the mass flow controllers (MFCs) 334A-D and the valve 340, the controller 320 can control the composition of liquid that is supplied to the spray nozzle 350.

More than one phosphor reservoir 330C and/or diffuser reservoir 330D can be provided and attached to the supply line through respective MFCs and/or supply valves that can be electronically controlled by the controller 320. For example, separate phosphor reservoirs can be provided for red phosphors, green phosphors, yellow phosphors, blue phosphors, etc., depending on the product requirements. Likewise, separate reservoirs may be provided for the broad spectrum luminescent materials versus the narrow-spectrum luminescent materials.

The heating device 337 applies heat 339 to the LED 310 to increase the temperature thereof prior to spraying the luminescent solution 354 thereon. The heating device 337 may be electronically controlled by the controller 320 via electronic control line 329. The heating device 337 may, but need not, apply heat 339 to the LED 310 during the spraying operation(s). In some embodiments, the LED 310 is heated to a temperature in a range of about 70 degrees Celsius to about 155 degrees Celsius. When the atomized luminescent solution 354 is deposited on the LED 310, the thermal energy in the heated LED 310 may rapidly cure and/or evaporate the solvent portion of the atomized luminescent solution 354 to form the recipient luminophoric medium 380 on LED 310.

A mixer 341 may be provided to mix supply line 336 constituents from various different ones of the reservoirs 330A-D and/or to agitate the supply line 336 constituents to keep particles in suspension and/or substantially uniformly distributed throughout the materials.

Figure 17:
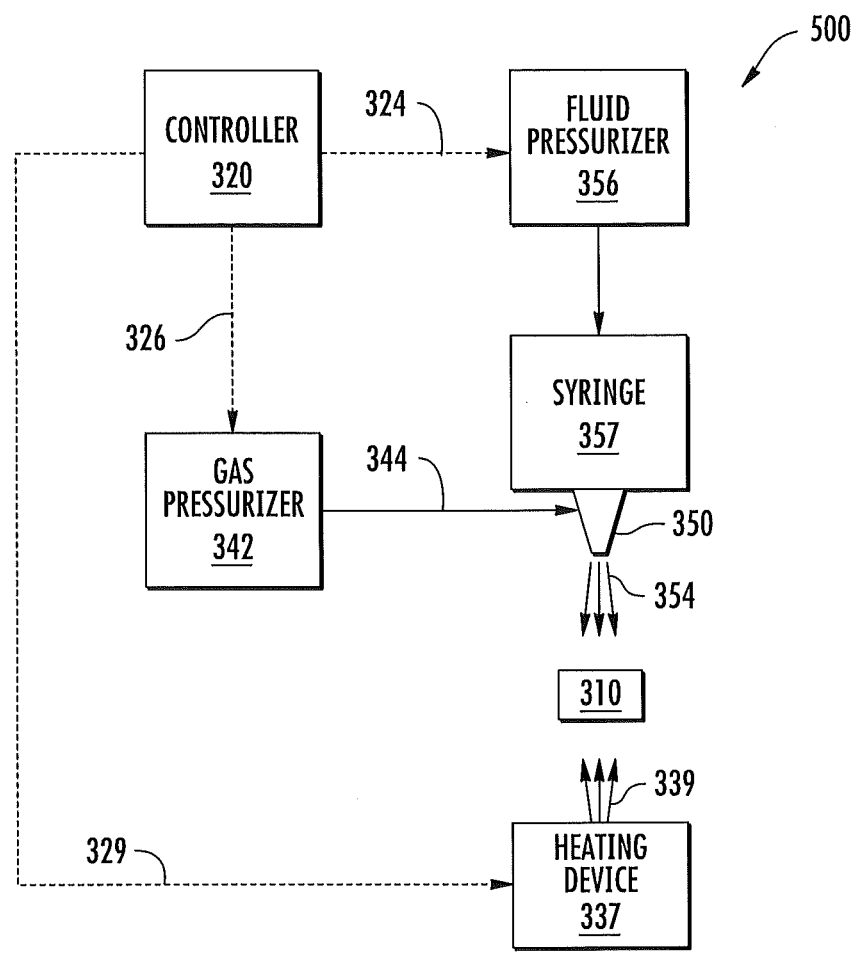
FIG. 17 is a schematic diagram illustrating a batch deposition system for depositing a recipient luminophoric medium according to some embodiments of the invention.

Reference is now made to FIG. 17, which is a schematic diagram illustrating a batch deposition system 500 for coating a light emitting device with a luminescent solution, according to some embodiments of the invention. As shown in FIG. 17, pressurized gas (e.g., pressurized air) generated by a gas pressurizer 342 may be supplied to a spray nozzle 350 through a pressurized gas supply line 344. A syringe 357 may be provided that includes a luminescent solution 354. The luminescent solution 354 may include, for example, one or more types of phosphor particles, one or more types of diffuser particles, a binder, and/or one or more solvents. The syringe 357 may be loaded with the luminescent solution 354 using, for example, a cartridge, shortly before the application operations to reduce settling and/or stratification of the components therein. A fluid pressurizer 356 may be provided to provide and/or control a fluid pressure within the syringe 357. Operations of the gas pressurizer 342, the fluid pressurizer 356 and the heating device 337 can be controlled by a controller 320 via electronic control lines 324, 326 and 329. By controlling the operations of the fluid pressurizer 356 and the gas pressurizer 342, the controller 320 can control the flow of liquid that is supplied to the spray nozzle 350.

As illustrated, the heating device 337 applies heat 339 to the LED 310 to increase the temperature thereof before the luminescent solution 354 is sprayed onto the LED 310. The heating device 337 may be electronically controlled by the controller 320 via electronic control line 329. The heating device 337 may apply heat 339 to the LED 310 before and/or during the spraying operation(s).

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to semiconductor light emitting devices that include LEDs, it will be appreciated that according to further embodiments of the present invention, laser diodes and/or other semiconductor lighting devices may be provided that include the luminophoric mediums discussed above.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
a light emitting diode ("LED"); and
a recipient luminophoric medium that is configured to down-convert at least some of the light emitted by the LED, the recipient luminophoric medium including at least:
a first broad-spectrum luminescent material that down-converts a first portion of the radiation emitted by the LED to radiation having a peak wavelength in the red color range; and
a first narrow-spectrum luminescent material that down-converts a second portion of the radiation emitted by the LED to radiation having a peak wavelength in the red color range.

2. The light emitting device of claim 1, the recipient luminophoric medium further comprising a second broad-spectrum luminescent material that down-converts a third portion of the radiation emitted by the LED to radiation having a peak wavelength in a color range other than the red color range.

3. The light emitting device of claim 2, further comprising a second narrow-spectrum luminescent material that down-converts a fourth portion of the radiation emitted by the LED to radiation having a peak wavelength in the green or cyan color range.

4. The light emitting device of claim 2, wherein the radiation emitted by the second broad-spectrum luminescent material has a peak wavelength in the green color range and has a full-width-half-maximum emission bandwidth that extends into the cyan color range.

5. The light emitting device of claim 2, wherein radiation emitted by the second broad-spectrum luminescent material has a peak wavelength between 525 nm and 550 nm and has a full-width-half-maximum emission bandwidth that extends below 500 nm.

6. The light emitting device of claim 5, the recipient luminophoric medium further comprising a third broad-spectrum luminescent material that down-converts a fourth portion of the radiation emitted by the LED to a radiation having a peak wavelength between 551 nm and 585 nm.

7. The light emitting device of claim 6, wherein the first broad-spectrum luminescent material comprises a $(Ca_{1-x}Sr_x)SiAlN_3:Eu^{2+}$ phosphor, the second broad-emission luminescent material comprises a LuAG:Ce phosphor, and the third broad-spectrum luminescent material comprises a YAG:Ce phosphor.

8. The light emitting device of claim 1, wherein the light emitting device emits a warm white light having a correlated color temperature between about 2500 K and about 4100 K, a CRI value of at least 90 and a Lumen equivalent output of at least 330 Lum/W-Optical.

9. The light emitting device of claim 1, wherein the recipient luminophoric medium is applied directly onto the LED, and wherein the recipient luminophoric medium includes a binder material that is cured by heat energy in the LED at the time the recipient luminophoric medium is applied to the LED.

10. A light emitting device, comprising:
a light emitting diode ("LED"); and
a recipient luminophoric medium that is configured to down-convert at least some of the light emitted by the LED, the recipient luminophoric medium including at least:
a first broad-spectrum luminescent material that down-converts a first portion of the radiation emitted by the LED to radiation having a peak wavelength in a first color range; and
a first narrow-spectrum luminescent material that down-converts a second portion of the radiation emitted by the LED to radiation having a peak wavelength in the first color range.

11. The light emitting device of claim 10, wherein the first color range is the red color range.

12. The light emitting device of claim 11, the recipient luminophoric medium further comprising a second broad-spectrum luminescent material that down-converts a third portion of the radiation emitted by the LED to radiation having a peak wavelength in the yellow color range.

13. The light emitting device of claim 12, the recipient luminophoric medium further comprising a third broad-spectrum luminescent material that down-converts a fourth portion of the radiation emitted by the LED to radiation having a peak wavelength in the green color range, and that has a full-width-half-maximum emission bandwidth that extends into the cyan color range.

14. The light emitting device of claim 11, the recipient luminophoric medium further comprising a second narrow-spectrum luminescent material that down-converts a third portion of the radiation emitted by the LED to radiation having a peak wavelength in the cyan color range.

15. The light emitting device of claim 11, wherein the first broad-emission luminescent material comprises a red phosphor having a peak wavelength of less than 620 nm and a full-width-half-maximum emission bandwidth of between about 60 nm and about 80 nm.

16. A light emitting device, comprising:
a light emitting diode ("LED"); and
a recipient luminophoric medium that is configured to down-convert at least some of the light emitted by the LED, the recipient luminophoric medium including at least:
a first broad-spectrum luminescent material that down-converts a first portion of the radiation emitted by the LED to radiation having a peak wavelength in the red color range;
a second broad-spectrum luminescent material that down-converts a third portion of the radiation emitted by the LED to radiation having a peak wavelength in a color range other than the red color range; and
a first narrow-spectrum luminescent material that down-converts a second portion of the radiation emitted by the LED to radiation having a peak wavelength in the cyan color range.

17. The light emitting device of claim 16, further comprising a second narrow-spectrum luminescent material that down-converts a fourth portion of the radiation emitted by the LED to radiation having a peak wavelength in the red color range.

18. The light emitting device of claim 16, wherein the narrow-spectrum luminescent material comprises a quantum dots material.

19. A light emitting device, comprising:
a light emitting diode ("LED"); and
a recipient luminophoric medium that is configured to down-convert at least some of the light emitted by the LED, the recipient luminophoric medium including at least:
a first broad-spectrum luminescent material that down-converts a first portion of the radiation emitted by the LED to radiation having a peak wavelength that is between 610 and 629 nm;
a second broad-spectrum luminescent material that down-converts a second portion of the radiation emitted by the LED to radiation having a peak wavelength below 600 nm; and
a narrow-spectrum luminescent material that down-converts a third portion of the radiation emitted by the LED to radiation having a peak wavelength in the red color range.

20. The light emitting device of claim 19, the recipient luminophoric medium further comprising a narrow-spectrum luminescent material that down-converts a third portion of the radiation emitted by the LED to radiation having a peak wavelength in the green color range or the cyan color range.

21. The light emitting device of claim 19, wherein the radiation emitted by the second broad-spectrum luminescent material has a peak wavelength in the green color range and has a full-width-half-maximum emission bandwidth that extends into the cyan color range.

22. A packaged light emitting device, comprising:
a light emitting diode ("LED") that emits light in the blue color range; and
a recipient luminophoric medium that is configured to down-convert at least some of the light emitted by the LED, the recipient luminophoric medium including at least:
a first broad-spectrum luminescent material that down-converts a first portion of the radiation emitted by the LED to radiation having a peak wavelength in a first color range; and
a first narrow-spectrum luminescent material that down-converts a second portion of the radiation emitted by the LED to radiation having a peak wavelength in the blue color range.

23. The packaged light emitting device of claim 22, further comprising a submount that includes at least one reflective portion, and wherein the recipient luminophoric medium is conformally coated on the LED and on the at least one reflective portion.

24. The packaged light emitting device of claim 23, wherein the first color range is the yellow color range, and wherein the recipient luminophoric medium further includes a second broad-spectrum luminescent material that down-converts a third portion of the radiation emitted by the LED to radiation having a peak wavelength in the red color range.

25. The packaged light emitting device of claim 24, wherein the recipient luminophoric medium further includes a third broad-spectrum luminescent material that down-converts a fourth portion of the radiation emitted by the LED to radiation having a peak wavelength in the green color range that has a full-width-half-maximum emission bandwidth that extends into the cyan color range.

26. The packaged light emitting device of claim 24, wherein the LED comprises a first blue LED, the packaged light emitting device further comprising a second blue LED mounted on the submount, wherein the recipient luminophoric medium is conformally coated to cover the two blue LEDs and a portion of the submount that between the two blue LEDs.

27. The packaged light emitting device of claim 26, wherein the two blue LEDs are connected in series.

28. The packaged light emitting device of claim 26, wherein the two blue LEDs are connected in parallel.

29. The light emitting device of claim 1, wherein the narrow-spectrum luminescent material comprises a line-emitter luminescent material.

30. The light emitting device of claim 10, wherein the first narrow-spectrum luminescent material comprises a line-emitter luminescent material.

31. The light emitting device of claim 16, wherein the first narrow-spectrum luminescent material comprises a line-emitter luminescent material.

32. The light emitting device of claim 1, wherein the LED comprises a blue LED that emits light in the blue color range, the light emitting device further comprising a second narrow-spectrum luminescent material that down-converts a third portion of the radiation emitted by the LED to radiation having a peak wavelength in the blue color range.

33. The light emitting device of claim 14, further comprising a third narrow-spectrum luminescent material that down-converts a fourth portion of the radiation emitted by the LED to radiation having a peak wavelength in a color range other than the cyan color range or the red color range.

34. The light emitting device of claim 19, wherein the LED comprises a blue LED that emits light in the blue color range and the narrow-spectrum luminescent material comprises a first narrow-spectrum luminescent material, further comprising a second narrow-spectrum luminescent material that down-converts a fourth portion of the radiation emitted by the LED to radiation having a peak wavelength in the blue color range.

* * * * *